US011972966B2

United States Patent
Choi et al.

(10) Patent No.: US 11,972,966 B2
(45) Date of Patent: Apr. 30, 2024

(54) METHOD OF MANUFACTURING A SEMICONDUCTOR PACKAGE INCLUDING CORRECTING ALIGNMENT ERROR WHILE FORMING REDISTRIBUTION WIRING STRUTURE

(71) Applicant: Samsung Electronics Co., Ltd., Suwon-si (KR)

(72) Inventors: Gyujin Choi, Asan-si (KR); Changeun Joo, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 62 days.

(21) Appl. No.: 17/007,433

(22) Filed: Aug. 31, 2020

(65) Prior Publication Data

US 2021/0183677 A1 Jun. 17, 2021

(30) Foreign Application Priority Data

Dec. 13, 2019 (KR) .......................... 10-2019-0166787

(51) Int. Cl.
*H01L 21/768* (2006.01)
*H01L 21/48* (2006.01)
(Continued)

(52) U.S. Cl.
CPC .......... *H01L 21/68* (2013.01); *H01L 21/4853* (2013.01); *H01L 21/563* (2013.01);
(Continued)

(58) Field of Classification Search
CPC ... H01L 21/68; H01L 21/4853; H01L 21/563; H01L 21/76838; H01L 22/34;
(Continued)

(56) References Cited

U.S. PATENT DOCUMENTS 8,656,333 B1 * 2/2014 Bishop .................. H01L 24/06
257/784
9,177,859 B2 11/2015 Chen et al.
(Continued)

FOREIGN PATENT DOCUMENTS

KR 20190052150 A 5/2019

*Primary Examiner* — Marcos D. Pizarro
*Assistant Examiner* — Tenley H Schofield
(74) *Attorney, Agent, or Firm* — HARNESS, DICKEY & PIERCE, P.L.C.

(57) ABSTRACT

In a method of manufacturing a semiconductor package, a plurality of semiconductor chips are encapsulated in a carrier to provide encapsulated semiconductor chips. A first surface of the encapsulated semiconductor chips includes chip pads exposed from a first surface of the carrier. An alignment error of each of the semiconductor chips with respect to the carrier is measured. A redistribution wiring structure may be formed on the first surface of the carrier. Correction values for each layer of the redistribution wiring structure may be reflected while forming the redistribution wiring structure in order to correct the alignment error while forming the redistribution wiring structure. The redistribution wiring structure may have redistribution wirings electrically connected to the chip pads on the first surface of the carrier. Outer connection members may be formed on the redistribution wiring structure and may be configured to be electrically connected to the outermost redistribution wirings.

19 Claims, 27 Drawing Sheets

(51) Int. Cl.
*H01L 21/56* (2006.01)
*H01L 21/66* (2006.01)
*H01L 21/68* (2006.01)
*H01L 23/00* (2006.01)
*H01L 23/31* (2006.01)
*H01L 23/495* (2006.01)
*H01L 23/522* (2006.01)
*H01L 23/528* (2006.01)
*H01L 23/532* (2006.01)

(52) U.S. Cl.
CPC ........ *H01L 21/76838* (2013.01); *H01L 22/34* (2013.01); *H01L 24/11* (2013.01); *H01L 24/14* (2013.01)

(58) Field of Classification Search
CPC ..... H01L 24/11; H01L 24/14; H01L 21/6835; H01L 23/3128; H01L 23/5389; H01L 23/544; H01L 24/19; H01L 24/96; H01L 24/97; H01L 2224/12105; H01L 2924/014; H01L 2924/01033
See application file for complete search history.

(56) References Cited

U.S. PATENT DOCUMENTS

| | | | |
|---|---|---|---|
| 9,520,331 B2 | 12/2016 | Scanlan et al. | |
| 9,786,580 B2 | 10/2017 | Yang et al. | |
| 9,989,858 B2* | 6/2018 | Slotboom | G03F 9/7096 |
| 10,306,777 B2 | 5/2019 | Lin et al. | |
| 2011/0018118 A1* | 1/2011 | Hsieh | H01L 21/6835 |
| | | | 257/690 |
| 2015/0364444 A1* | 12/2015 | Scanlan | H01L 22/12 |
| | | | 438/5 |
| 2016/0204056 A1 | 7/2016 | Lin et al. | |
| 2017/0069555 A1* | 3/2017 | Milaninia | B01L 3/502707 |
| 2017/0103927 A1* | 4/2017 | Bishop | H01L 23/5389 |
| 2019/0122981 A1 | 4/2019 | Plavidal et al. | |
| 2019/0139901 A1* | 5/2019 | Scanlan | H01L 23/3107 |
| 2019/0221448 A1 | 7/2019 | Bae | |
| 2021/0063997 A1* | 3/2021 | Hosokawa | G05B 19/4097 |
| 2021/0082870 A1* | 3/2021 | Wu | H01L 21/6835 |
| 2021/0125936 A1* | 4/2021 | Wang | H01L 21/6835 |

* cited by examiner

METHOD OF MANUFACTURING A SEMICONDUCTOR PACKAGE INCLUDING CORRECTING ALIGNMENT ERROR WHILE FORMING REDISTRIBUTION WIRING STRUTURE

PRIORITY STATEMENT

This application claims priority under 35 U.S.C. § 119 to Korean Patent Application No. 10-2019-0166787, filed on Dec. 13, 2019 in the Korean Intellectual Property Office (KIPO), the contents of which are herein incorporated by reference in their entirety.

BACKGROUND

1. Field

Example embodiments relate to a method of manufacturing the semiconductor package. More particularly, example embodiments relate to a method of manufacturing a fan-out package.

2. Description of Related Art

In manufacturing a fan-out package, processes of rearranging a plurality of dies and encapsulating the dies in a carrier may be performed. Although the dies are designed to be arranged at equal intervals, the dies may be positioned to deviate from the design positions due to process errors such as thermal expansion occurring in a rearrangement process and the encapsulation process. It may be necessary to secure conformity margin with a redistribution wiring process and a back-end process in consideration of an alignment error of the die.

However, in order to secure such a conformity margin, the outermost redistribution wiring must be formed to have a sufficient area, and thus, in the package manufacturing process, gas discharge of reaction products and volatile solvents of an underlying layer may be limited and/or prevented, thereby deteriorating interface reliability and causing process failures.

SUMMARY

Example embodiments provide a method of manufacturing the semiconductor package having miniaturization and excellent reliability and capable of reducing process costs.

According to an embodiment, a method of manufacturing a semiconductor package includes encapsulating a plurality of semiconductor chips in a carrier to provide encapsulated semiconductor chips, a first surface of each of the encapsulated semiconductor chips including chip pads exposed from a first surface of the carrier; measuring an alignment error of each of the encapsulated semiconductor chips with respect to the carrier; forming a redistribution wiring structure on the first surface of the carrier; and forming outer connection members on the redistribution wiring structure. The forming the redistribution wiring structure includes reflecting correction values for each layer of the redistribution wiring structure in order to correct the alignment error while forming the redistribution wiring structure. The redistribution wiring structure has redistribution wirings electrically connected to the chip pads of the encapsulated semiconductor chips. The redistribution wiring structure has outermost redistribution wirings among the redistribution wirings. The outer connection members are electrically connected to the outermost redistribution wirings.

According to an embodiment, a method of manufacturing a semiconductor package includes encapsulating a plurality of semiconductor chips in a carrier to provide encapsulated semiconductor chips, a first surface of each of the encapsulated semiconductor chips including chip pads exposed from a first surface of the carrier; measuring an alignment error of each of the encapsulated semiconductor chips with respect to the carrier; determining correction values for each layer of a plurality of redistribution wiring layers of a redistribution wiring structure to be stacked on the first surface of the carrier, based on the alignment error of each of the encapsulated semiconductor chips; forming the redistribution wiring structure on the first surface of the carrier, the forming the redistribution wiring structure including reflecting the correction values while forming the plurality of the redistribution wiring layers of the redistribution wiring structure to correct the alignment error, the redistribution wiring structure having outermost redistribution wirings; and forming outer connection members on the redistribution wiring structure, the outer connection members being electrically connected to the outermost redistribution wirings.

According to an embodiment, a method of manufacturing a semiconductor package includes arranging semiconductor chips diced from a wafer on a dummy substrate; forming a carrier on the dummy substrate to cover the semiconductor chips to provide encapsulated semiconductor chips; removing the dummy substrate such that the encapsulated semiconductor chips are exposed from a first surface of the carrier; measuring an alignment error of each of the encapsulated semiconductor chips with respect to the carrier; determining correction values for each layer of a plurality of redistribution wiring layers of a redistribution wiring structure to be stacked on the first surface of the carrier, based on the alignment error of each of the encapsulated semiconductor chips; reflecting the correction values while forming the plurality of the redistribution wiring layers to correct the alignment error, the redistribution wiring structure having outermost redistribution wirings among the plurality of redistribution wiring layers; and forming outer connection members on the redistribution wiring structure, the outer connection member being electrically connected to the outermost redistribution wirings.

According to an embodiment, a plurality of semiconductor chip may be encapsulated in a carrier, and a redistribution wiring process may be performed to form a redistribution wiring structure having redistribution wirings electrically connected to chip pads of the semiconductor chips. A solder ball process may be performed to form outer connection members on the redistribution wiring structure, the outer connection members being electrically connected to the outermost redistribution wirings. A singulation process may be performed to saw the carrier to complete a fan-out package.

Correction values for each layer distributed in order to correct an alignment error of the semiconductor chip on the carrier may be sequentially reflected in exposure processes for forming redistribution wiring layers of the redistribution wiring structure to thereby secure in advance conformity margin required in the following solder ball process. Accordingly, in order to secure the conformity margin, it may not necessary to greatly enlarge a size of the landing pad of the outermost redistribution wiring.

Thus, as the pad size of the outermost redistribution wiring is reduced, gas discharge of reaction products and volatile solvents of an underlying layer may be facilitated.

Further, input/output and power wirings may be additionally disposed through an area secured by reducing the pad size of the redistribution wiring, and as the clearance required in the singulation process is reduced, wiring, shielding, or dummy metal may be arranged to the outer periphery of the package to thereby improve electrical characteristics (PI, SI, EMI), mechanical strength, and heat dissipation characteristics. By reducing the size of the package through the reduction of the clearance, it may be possible to obtain the effect of miniaturization and cost reduction.

BRIEF DESCRIPTION OF THE DRAWINGS

Example embodiments will be more clearly understood from the following detailed description taken in conjunction with the accompanying drawings.

FIGS. 1 to 16B represent non-limiting, example embodiments as described herein.

FIG. 1 is a flow chart illustrating a method of manufacturing a semiconductor package in accordance with example embodiments.

FIG. 2 is a flow chart illustrating stages of a redistribution wiring process in FIG. 1.

FIGS. 3 to 7, 8A, 9A, 10A, 11A, 12A, 13A and 14 are cross-sectional views illustrating a method of manufacturing a semiconductor package in accordance with example embodiments.

FIGS. 8C to 11C and 13C are enlarged cross-sectional views illustrating A, B, C, D and E portions in FIGS. 11A to 13C and 13A respectively.

FIG. 16B is a view illustrating a redistribution wiring structure formed by a method of manufacturing a semiconductor package in accordance with a comparative embodiment.

DETAILED DESCRIPTION OF EXAMPLE EMBODIMENTS

Hereinafter, example embodiments will be explained in detail with reference to the accompanying drawings.

Figure 1:
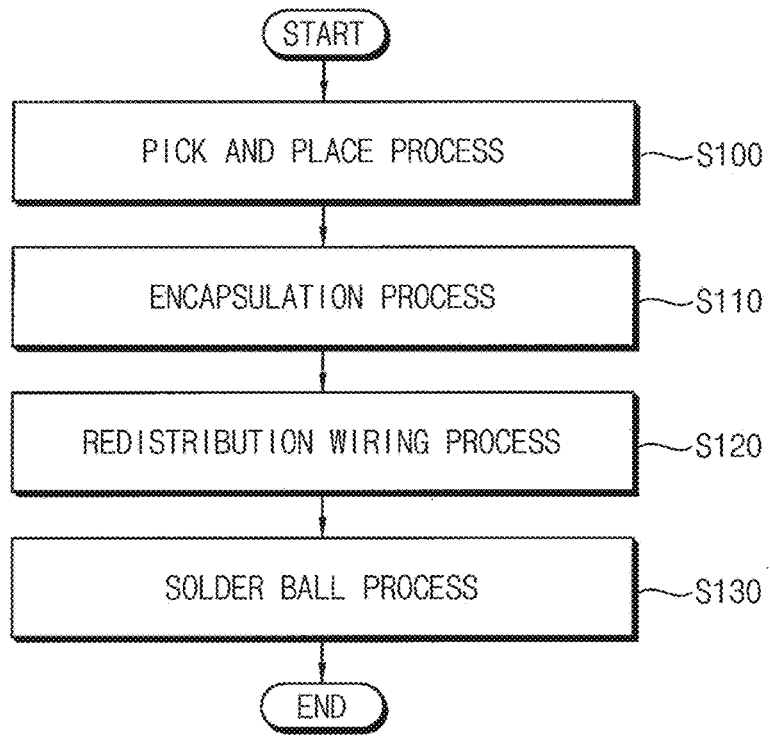
Figure 2:
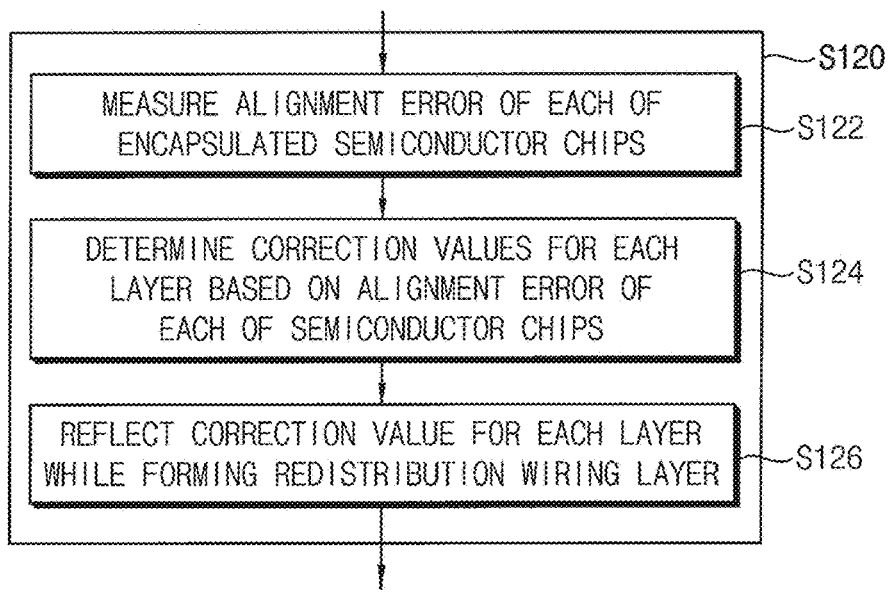

FIG. 1 is a flow chart illustrating a method of manufacturing a semiconductor package in accordance with example embodiments. FIG. 2 is a flow chart illustrating stages of a redistribution wiring process in FIG. 1.

Referring to FIGS. 1 and 2, first, individual dies (semiconductor chips) diced from a wafer may be rearranged and encapsulated in a carrier (S100, S110).

In example embodiments, in the rearrangement process (pick and place process), after performing a dicing process on the wafer to individual dies, an inspection process may be performed on the individual dies. Dies that are judged to be good may be arranged on a dummy substrate. The dies may be adhered on the dummy substrate by an adhesive member such as thermal release tape.

In the encapsulation process, after forming a carrier on the dummy substrate to cover the dies, the dummy substrate may be removed to expose the dies from a first surface of the carrier.

In particular, a molding member may be formed on the dummy substrate to cover the dies, and then, the molding member may be cured. In the stage of curing, the thermal release tape may be heated to lose adhesive strength such that the thermal release tap may be removed from the molding member. Thus, the dies may be encapsulated in the carrier. First surfaces of the dies on which chips pads are formed may be exposed from a first surface of the carrier.

For example, the carrier may include a panel carrier. About 200 to about 6,000 dies may be arranged in the carrier having a panel shape. In this case, the semiconductor package may be referred to as a fan-out panel level package. Alternatively, the carrier may include a wafer carrier. In this case, the semiconductor package may be referred to as a fan-out wafer level package.

The dies may be designed to be arranged at a desired (and/or alternatively predetermined) constant (e.g., equal) intervals on the carrier. However, the dies may be positioned to deviate from the design position due to process errors such as thermal expansion occurring in the rearrangement process and the encapsulation process, resulting in an alignment error D.

Then, a redistribution wiring structure having redistribution wirings electrically connected to the chip pads may be formed on the first surface of the carrier (redistribution wiring process) (S120), and then, outer connection members electrically connected to the outermost redistribution wirings may be formed on the redistribution wiring structure (solder ball process) (S130).

In example embodiments, while redistribution wiring layers are formed by the redistribution wiring process, the alignment error D of the die may be corrected by sequentially reflecting correction values for each layer (sequential regression correction). In an exposure process for forming each of the redistribution wiring layers, correction for conformity margin required in the solder ball process may be performed.

In particular, in the redistribution wiring process, the alignment error of each of the dies with respect to the carrier may be measured (S122), the correction values for each layer of a plurality of the redistribution wiring layers of the redistribution wiring structure may be determined based on the alignment error of each of the dies (S124), and the correction values for each layer may be sequentially reflected while forming a plurality of the redistribution wiring layers, to thereby correct the alignment error (S126).

First, in the operation S122, the alignment error D of each of the dies with respect to the carrier may be measured using a global reference target on the carrier. The global reference target may include a carrier alignment key positioned outside the die. The alignment error D of the die may be represented by a displacement value (difference value) of an actual origin coordinate (Or) of the die with respect to a design origin coordinate (Oi) of the die.

In the operation S124, the correction values for each layer of a plurality of the redistribution wiring layers may be determined (e.g., calculated, measured) according to the alignment error of the die. The alignment error D may be distributed as the correction values for each layer of the redistribution wiring layers. The correction values for each layer may be determined in consideration of material, structural characteristics, tolerances, etc. of each layer. For example, the correction values for each layer may be determined (e.g., calculated, measured) to be the same as each other. Alternatively, the correction values may be determined (e.g., calculated, measured) to have different weights for the correction values for each layer respectively.

In the operation S126, the correction values for each layer may be sequentially reflected while forming a plurality of the redistribution wiring layers, to thereby correct the alignment error D.

For example, in case that the redistribution wiring structure has first and second redistribution wiring layers in two levels, an exposure process may be performed twice to form the first redistribution wiring layer having first redistribution wirings and an exposure process may be performed twice to form the second redistribution wiring layer having second redistribution wirings.

In this case, after forming a first insulating layer on the first surface of the carrier, a first exposure process based on a first correction value for each layer may be performed to form a first opening (first via) in the first insulating layer. Then, a second exposure process based on a second correction value for each layer may be performed to form the first redistribution wiring on the first insulation layer filling the first opening.

After forming a second insulating layer on the first insulating layer to cover the first redistribution wiring, a third exposure process based on a third correction value for each layer may be performed to form a second opening (second via) in the second insulating layer. Then, a fourth exposure process based on a fourth correction value for each layer may be performed to form the second redistribution wiring on the second insulation layer filling the second opening.

The first to fourth correction values for each layer may be the same as or different form each other. Each of the first to fourth correction values for each layer may have an inverse vector value of an alignment error vector.

The first to fourth exposure processes may be performed in a local alignment manner according to a position of each of the dies. For example, the exposure process may be performed on each die using a stepper. Since the exposure process is performed to be aligned with the position of each die, the first and second redistribution wirings may be matched to each die. When performing the exposure process, an alignment key located in each die may be measured and the measured deviation may be taken into account, so that the exposure position can be aligned with each die. Accordingly, when performing the exposure process in each level, the measured deviation and the correction value for each layer may be reflected to determine the exposure position.

A portion of the outermost second redistribution wiring may serve as a landing pad, that is, a package pad, on which an outer connection member such as a solder ball is disposed. The first to fourth correction values for each layer distributed in order to correct the alignment error D of the die, may be sequentially reflected in the exposure processes for forming the redistribution wiring layers of the redistribution wiring structure, to thereby secure in advance conformity margin required in a following solder ball process. Accordingly, in order to secure the conformity margin, it may not necessary to greatly enlarge a size of the landing pad of the outermost second redistribution wiring. Thus, as the pad size of the outermost redistribution wiring is reduced, gas discharge of reaction products and volatile solvents of an underlying layer may be facilitated.

Then, outer connection members may be formed on the redistribution wiring structure to be electrically connected to the outermost second redistribution wirings. For example, a solder ball as the outer connection member may be formed on a portion of the outermost redistribution wiring. The solder balls may be formed respectively on the package pads on an outer surface of the redistribution wiring structure by a solder ball attach process.

In particular, a protective layer may be formed on the redistribution wiring structure having holes which expose portions of the outermost second redistribution wirings. After forming an under bump metallurgy (UBM) layer on the exposed landing pads of the outermost second redistribution wirings, the solder balls may be formed on the under bump metallurgy layer.

A back-end process including the solder ball process may be performed in a global alignment manner according to a position of the carrier. The back-end process may be performed to be aligned with respect to a global reference target of the carrier without aligning with each die position. That is, a laser processing process of forming the holes for exposing the landing pad regions of the outermost second redistribution wirings may be performed using the global reference target outside the dies. Accordingly, the back-end process may be performed entirely on the carrier based on the design origin coordinate (Oi) of each of the dies without considering the alignment error of each of the dies.

Then, a singulation process may be performed to cut the carrier, to complete a fan-out package.

As mentioned above, the correction values for each layer distributed in order to correct the alignment error D of the die may be sequentially reflected in the exposure processes for forming the redistribution wiring layers of the redistribution wiring structure to thereby secure in advance conformity margin required in a following solder ball process. Accordingly, in order to secure the conformity margin, it may not necessary to greatly enlarge a size of the landing pad of the outermost second redistribution wiring.

Thus, as the pad size of the outermost redistribution wiring is reduced, gas discharge of reaction products and volatile solvents of an underlying layer may be facilitated. Further, input/output and power wirings may be additionally disposed through an area secured by reducing the pad size of the redistribution wiring, and as the clearance required in the singulation process is reduced, wiring, shielding, or dummy metal may be arranged to the outer periphery of the package to thereby improve electrical characteristics (PI, SI, EMI), mechanical strength, and heat dissipation characteristics. By reducing the size of the package through the reduction of the clearance, it may be possible to obtain the effect of miniaturization and cost reduction.

Hereinafter, a method of manufacturing the semiconductor package in FIG. 1 will be explained in comparison with a method of manufacturing a semiconductor package in a comparative embodiment.

Figure 3:
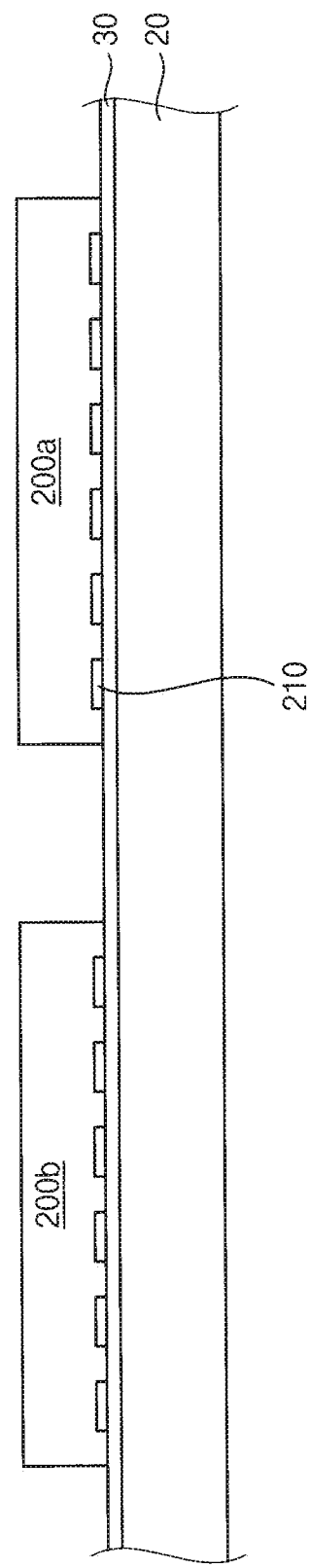
Figure 4:
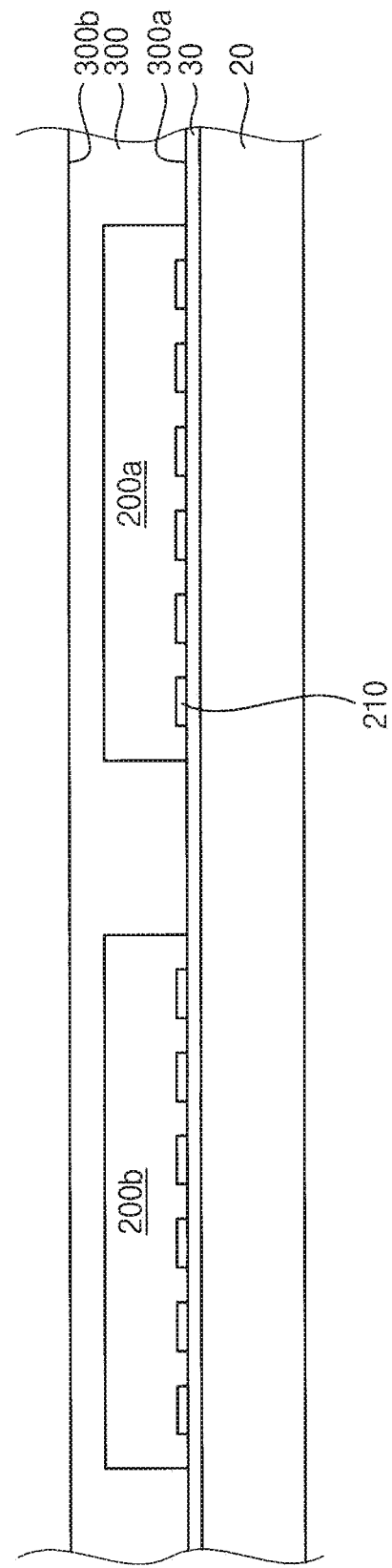
Figure 5:
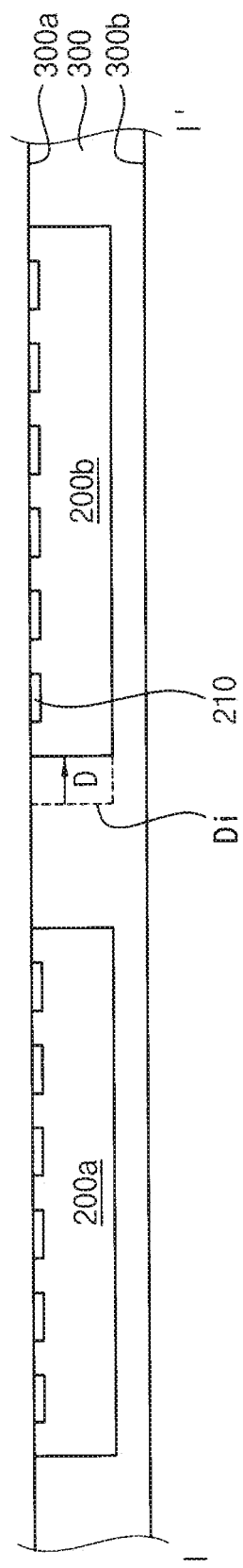
Figure 6:
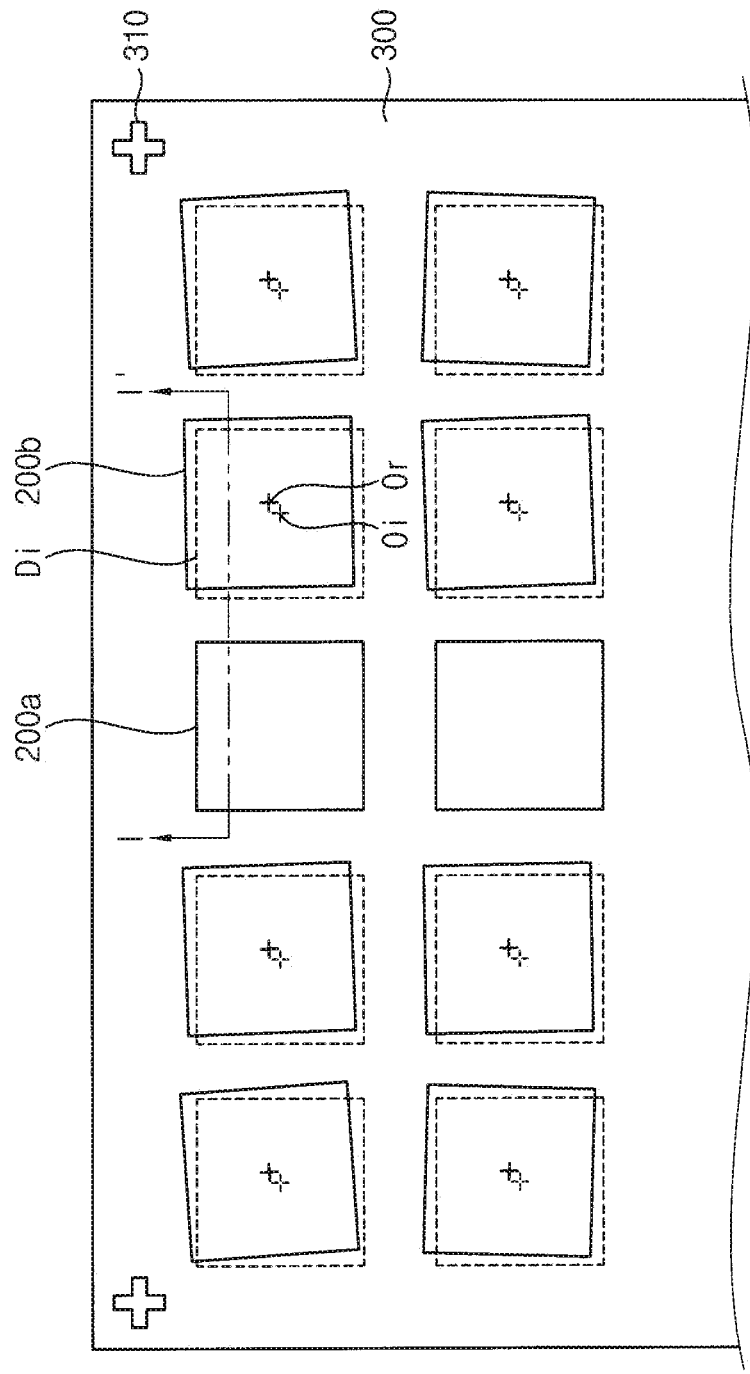
Figure 7:
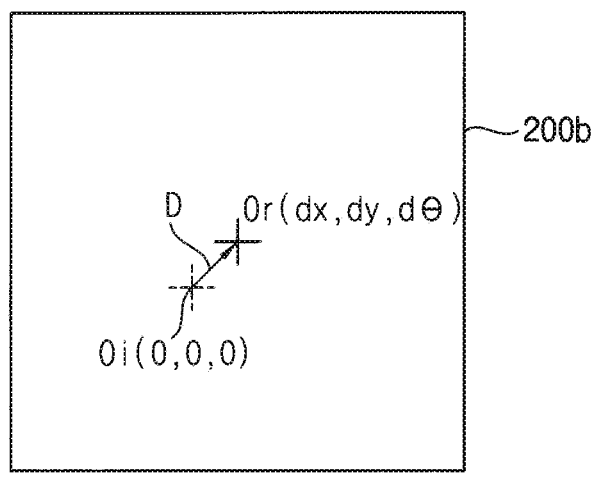

FIGS. 3 to 7, 8A, 9A, 10A, 11A, 12A, 13A and 14 are cross-sectional views illustrating a method of manufacturing a semiconductor package in accordance with example embodiments. FIGS. 8B, 9B, 10B, 11B, 12B and 13B are cross-sectional views illustrating a method of manufacturing a semiconductor package in a comparative embodiment. FIG. 6 is a plan view illustrating a portion of a carrier in which semiconductor packages are encapsulated. FIG. 7 is a plan view illustrating an alignment error of the semiconductor chip in FIG. 6. FIGS. 8C to 11C and 13C are enlarged cross-sectional views illustrating A, B, C, D and E portions in FIGS. 11A to 13C and 13A respectively. FIG. 5 is a cross-sectional view taken along the line I-I' in FIG. 6. FIGS.

8B, 9B, 10B, 11B, 12B and 13B represent process stages corresponding to process stages of FIGS. 8A, 9A, 10A, 11A, 12A and 13B respectively.

Referring to FIG. 3, after forming a separation layer 30 on a dummy substrate 20, semiconductor chips (dies) 200a, 200b diced from a wafer may be arranged on the separation layer 30.

In example embodiments, the dummy substrate 20 may be used as a base substrate on which a plurality of the semiconductor chips is arranged and a carrier (mold substrate) is to be formed to encapsulating the semiconductor chips. The dummy substrate 20 may have a shape corresponding to a panel carrier according to the number of the semiconductor chips arrange thereon. Alternatively, the dummy substrate 20 may have a shape corresponding to a wafer on which a semiconductor fabrication process is performed. The dummy substrate 20 may include, for example, a silicon substrate, a glass substrate, or a non-metal or metal plate.

The separation layer 30 may include a polymer tape acting as a temporary adhesive. The separation layer 30 may include a material capable of losing adhesive strength when it is subjected to light or heat. The separation layer 30 may include an adhesive member such as thermal release tape. Alternatively, the separation layer 30 may include, for example, dual curing silicone adhesive capable of cross-linking upon exposure to visible light or ultraviolet radiation.

An inspection process may be performed on the individual semiconductor chips (dies) diced from the wafer by a dicing process. Dies that are judged to be good may be arranged on the dummy substrate 20 by a rearrangement process (pick and place process).

In example embodiments, each of the semiconductor chips 200a, 200b may include a plurality of chip pads 210 on a first surface (e.g., active surface) thereof. The semiconductor chips 200a, 200b may be disposed on the dummy substrate 20 such that the first surface thereof on which the chip pads 210 are formed faces toward the dummy substrate 20.

In some embodiments, the number, configuration and arrangement of the chip pads 210 may be modified according to the inventive concepts. In some embodiments, a plurality of stacked semiconductor chips 200 may be formed on the dummy substrate 10.

Although only some chip pads are illustrated in the figures, structures and arrangements of the chip pads are examples, and it may not limited thereto. Although two semiconductor chips are illustrated in the figure, it may be understood that the number of the semiconductor chips may not be limited thereto.

The semiconductor chip may include integrated circuits. For example, the semiconductor chip may be a logic chip including logic circuits, such as a controller to control a memory chip. The semiconductor chip may be a memory chip including memory circuits, such as DRAM, SRAM, a flash memory, PRAM, ReRAM, FRAM, or MRAM.

Referring to FIG. 4, the carrier (mold substrate) 300 may be formed on the dummy substrate 20 to cover the semiconductor chips 200a, 200b.

In example embodiments, the carrier 300 covering the semiconductor chips 200a, 200b may be formed by forming a molding material on the separation layer 30 by an encapsulation process. The carrier 300 may include, for example, an epoxy molding compound.

Referring to FIGS. 5 to 7, the structure of FIG. 4 including the carrier 300 may be inverted and the dummy substrate 20 and the separation layer 30 may be removed from the carrier 300, and then, an alignment error (D) of each of the semiconductor chips 200a, 200b with respect to the carrier 300 may be measured.

In example embodiments, the separation layer 30 may be heated to remove the dummy substrate 20 from the carrier 300. As the dummy substrate 20 is removed, the first surfaces of the semiconductor chips 200a, 200b may be exposed from a first surface 300a of the carrier 300. Accordingly, the chip pads 210 of the semiconductor chips 200a, 200b may be exposed from the first surface 300a of the carrier 300.

For example, the carrier may include a panel carrier. About 200 to about 6,000 dies may be arranged in the carrier having the panel shape. In this case, this process may be referred to as a panel level package process.

Although the semiconductor chips are designed to be arranged at a desired (and/or alternatively predetermined) constant (e.g., equal) intervals on the carrier 300, the semiconductor chips may be positioned to deviate from the design position due to process errors such as thermal expansion occurring in the rearrangement process and the encapsulation process, resulting in the alignment errors D. In FIGS. 5 to 7, the semiconductor chip 200a may be positioned at the design position, and the semiconductor chip 200b may be positioned to deviate by a deviation D from the design position.

In example embodiments, as illustrated in FIGS. 6 and 7, the alignment error D of each of the semiconductor chips with respect to the carrier 300 may be measured using a global reference target on the carrier 300. The global reference target may include a carrier alignment key 310 positioned outside the die. An actual origin coordinate of the semiconductor chip may be measured in 3-dimensional coordinate system defined on the carrier using the global reference target. The alignment error D of the semiconductor chip 200b may be represented by a displacement (difference) (dx, dy, dθ) of the actual origin coordinate (Or) of the semiconductor chip 200b with respect to a design origin coordinate (Oi) of the semiconductor chip 200b.

Referring to FIGS. 8A, 9A, 10A and 11A, a redistribution wiring structure 100 having redistribution wirings electrically connected to the chip pads 210 may be formed on the first surface of the carrier 300. FIGS. 8B, 9B, 10B and 11B illustrate a redistribution wiring process stages according to a comparative embodiment corresponding to redistribution wiring process stages of FIGS. 8A, 9A, 10A and 11A respectively.

In example embodiments, while redistribution wiring layers are formed by a redistribution wiring process, the alignment error D of the semiconductor chip 200b may be corrected by sequentially reflecting correction values for each layer (sequential regression correction). In an exposure process for forming each of the redistribution wiring layers, correction for conformity margin required in a solder ball process subsequent to the redistribution wiring process may be performed in advance.

In particular, in the redistribution wiring process, first, the alignment error D of each of the semiconductor chips 200a, 200b with respect to the carrier 300 may be measured, and the correction values for each layer of a plurality of the redistribution wiring layers of the redistribution wiring structure 100 may be determined according to the alignment error D of each of the semiconductor chips 200a, 200b. Then, the correction values for each layer may be sequentially reflected while forming a plurality of the redistribution wiring layers, to thereby correct the alignment error D.

The correction values for each layer of a plurality of the redistribution wiring layers formed on the semiconductor chip 200b may be determined based on the alignment error D of the semiconductor chip 200b. The alignment error D may be distributed as the correction values for each layer of the redistribution wiring layers. The correction values for each layer may be determined in consideration of material, structural characteristics, tolerances, etc. of each layer. For example, the correction values for each layer may be determined to be the same as each other. Alternatively, the correction values may be determined to have different weights for the correction values for each layer respectively.

In FIGS. 8A, 9A, 10A and 11A, the redistribution wiring structure 100 may have first and second redistribution wiring layers. In this case, an exposure process may be performed twice to form the first redistribution wiring layer having first redistribution wirings, and an exposure process may be performed twice to form the second redistribution wiring layer having second redistribution wirings. The alignment error D of the semiconductor chip 200b may be distributed to first to fourth correction values for each layer in the four exposure processes. For example, the first to fourth correction values for each layer may be determined to have −D/4. The number, arrangements, etc. of the redistribution wiring layers are examples, and inventive concepts are not be limited thereto.

Figure 8A:
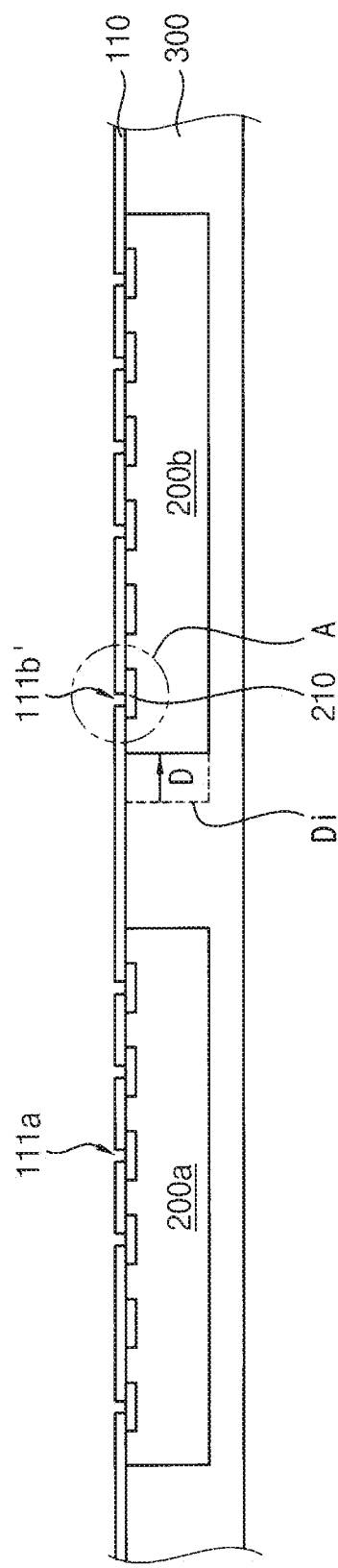

As illustrated in FIG. 8A, after forming a first insulating layer 110 to cover the first surface 300a of the carrier 300, the first insulating layer 110 may be patterned to form first openings 111a, 111b' exposing the chip pads 210 respectively.

The first insulating layer 110 may include, for example, a polymer or a dielectric material. The first insulating layer 110 may be formed by, for example, a vapor phase deposition process or a spin coating process.

The first openings 111a, 111b' may be formed by an exposure process. The exposure process may be performed in a local alignment manner according to a position of each of the semiconductor chips 200a, 200b. For example, the exposure process may be performed on each semiconductor using a stepper. Since the exposure process is performed to be aligned with the position of each semiconductor chip, the first openings may be matched to each semiconductor chip. When performing the exposure process, a die alignment key located in each semiconductor chip may be measured and the measured deviation may be taken into account, so that the exposure position can be aligned with each semiconductor chip.

Since an alignment error does not exist in the semiconductor chip 200a, the correction value for each layer may not be reflected in the exposure process. Accordingly, the exposure process performed on the first insulating layer 110 on the semiconductor chip 200a may be performed to be aligned with the position of the semiconductor chip 200a based on the die alignment key. Thus, the first opening 111a may be formed in the first insulating layer 110 by the exposure process that does not consider the correction value for each layer.

Since the alignment error D exists in the semiconductor chip 200b, the correction value for each layer may be reflected in the exposure process. Accordingly, the exposure process performed on the first insulating layer 110 on the semiconductor chip 200b may be performed based on the die alignment key such that the first correction value for each layer is reflected. Thus, the first opening 111b' may be formed in the first insulating layer 110 by the exposure process based on the first correction value for each layer.

Figure 8B:
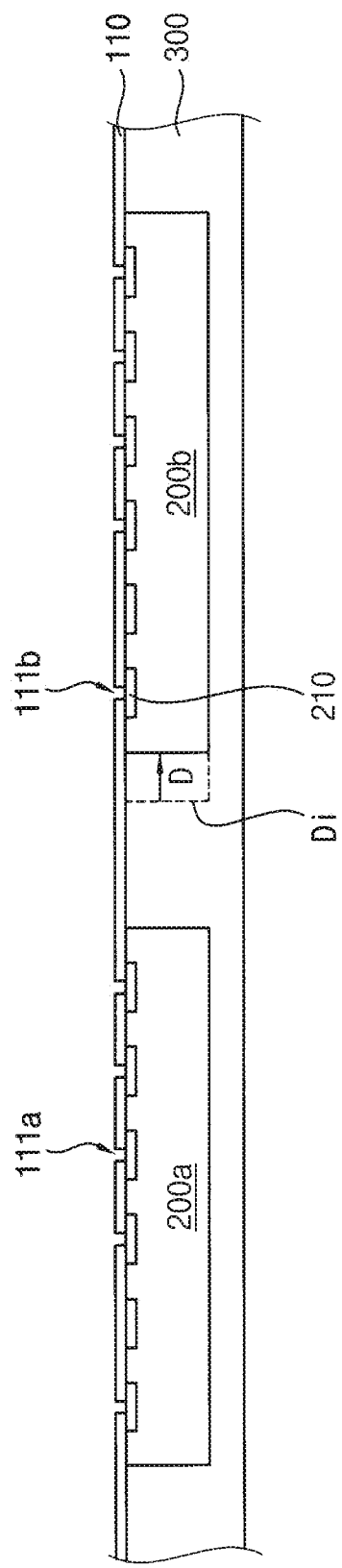
FIGS. 8B, 9B, 10B, 11B, 12B and 13B are cross-sectional views illustrating a method of manufacturing a semiconductor package in a comparative embodiment.

Referring to FIG. 8B, in a redistribution wiring process according to a comparative embodiment, although the alignment error D exists in the semiconductor chip 200b, an exposure process performed on the first insulating layer 110 on the semiconductor chip 200b may be performed to be aligned with the position of the semiconductor chip 200b based on the die alignment key without considering the correction value for each layer.

Figure 8C:
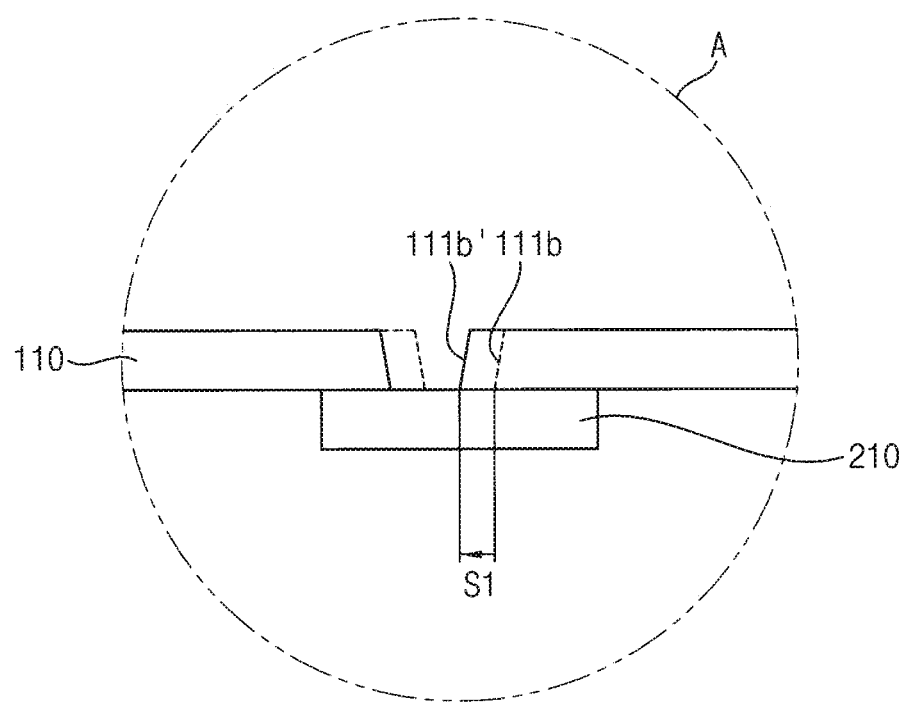

Accordingly, as illustrated in FIG. 8C, the first opening 111b' formed by the exposure process in which the first correction value for each layer is reflected may be shifted by a first distance S1 in a reverse direction of an alignment error vector ($\vec{D}$) from the first opening 111b formed by the exposure process according to the comparative embodiment.

Figure 9A:
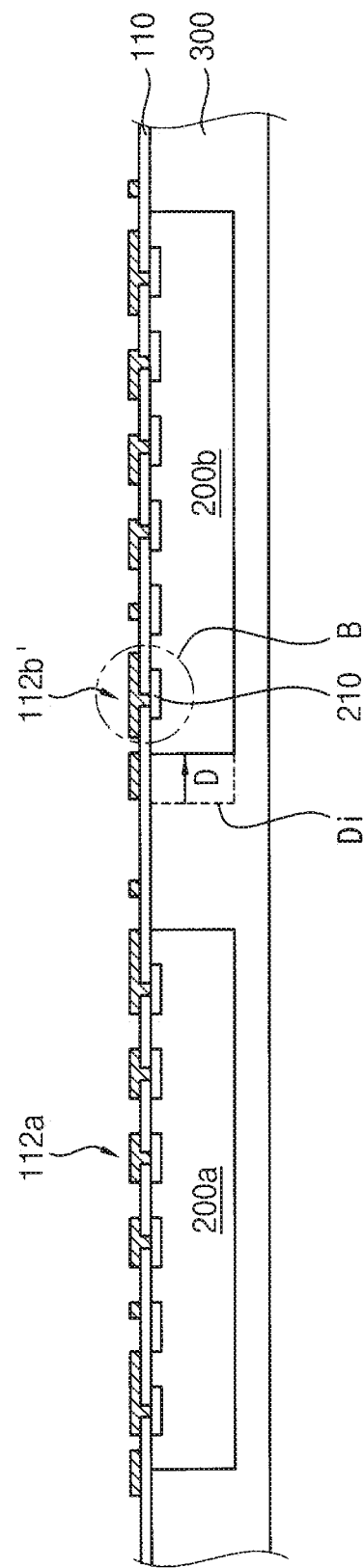

Referring to FIG. 9A, first redistribution wirings 112a, 112b' may be formed on the first insulating layer 110 to be directly connected to the chip pads 210 through the first openings 111a, 111b'.

In example embodiments, the first redistribution wirings 112a, 112b' may be formed on portions of the first insulating layer 110 and the chip pads 210, respectively. The first redistribution wirings 112a, 112b' may be formed by, after forming a seed layer on the first insulating layer 110 and in the first openings 111a, 111b', patterning the seed layer and performing an electrolytic plating process. Thus, the first redistribution wirings 112a, 112b' may directly contact the chip pads 210 through the first openings.

For example, in order to pattern the seed layer, after forming a photoresist layer on the seed layer, an exposure process and a development process may be performed on the photoresist layer to form a first photoresist pattern for exposing a first redistribution wiring region. The electrolytic plating process may be performed to form the first redistribution wirings 112a, 112b' in the first redistribution wiring region defined by the first photoresist pattern. The first redistribution wirings 112a, 112b' may include Al, Cu, Sn, Ni, Au, Pt, or an alloy thereof.

Then, after removing the first photoresist pattern by a strip process, the remaining seed layer may be removed by a wet etch process.

In example embodiments, the first photoresist pattern for exposing the regions of the first redistribution wirings 112a, 112b' may be formed by the exposure process. The exposure process may be performed in a local alignment manner according to a position of each of the semiconductor chips 200a, 200b. For example, the exposure process may be performed on each semiconductor using a stepper. Since the exposure process is performed to be aligned with the position of each semiconductor chip, the first redistribution wirings may be matched to each semiconductor chip. When performing the exposure process, a die alignment key located in each semiconductor chip may be measured and the measured deviation may be taken into account, so that the exposure position can be aligned with each semiconductor chip.

Since an alignment error does not exist in the semiconductor chip 200a, the correction value for each layer may not be reflected in the exposure process. Accordingly, the exposure process performed on the photoresist layer on the semiconductor chip 200a may be performed to be aligned with the position of the semiconductor chip 200a based on the die alignment key. Thus, the first redistribution wiring 112a may be formed on the first insulating layer 110 by the exposure process that does not consider the correction value for each layer.

Since the alignment error D exists in the semiconductor chip 200b, the correction value for each layer may be reflected in the exposure process. Accordingly, the exposure process performed on the photoresist layer on the semiconductor chip 200b may be performed based on the die alignment key such that the second correction value for each layer is reflected. Thus, the first redistribution wiring 112b' may be formed on the first insulating layer 110 by the exposure process based on the second correction value for each layer.

Figure 9B:
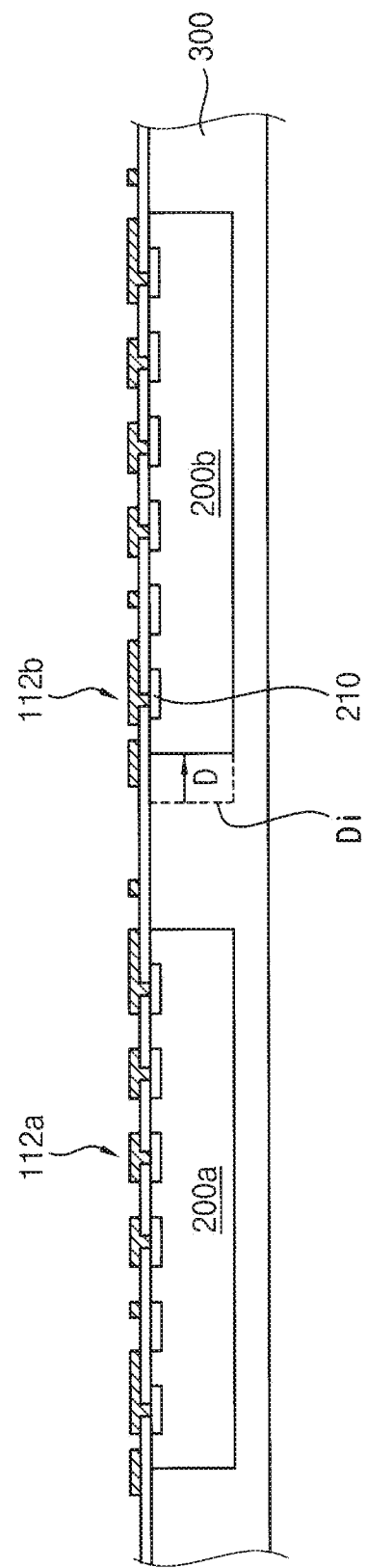

Referring to FIG. 9B, in the redistribution wiring process according to a comparative embodiment, although the alignment error D exists in the semiconductor chip 200b, an exposure process performed on the first photoresist layer on the semiconductor chip 200b may be performed to be aligned with the position of the semiconductor chip 200b based on the die alignment key without considering the correction value for each layer.

Figure 9C:
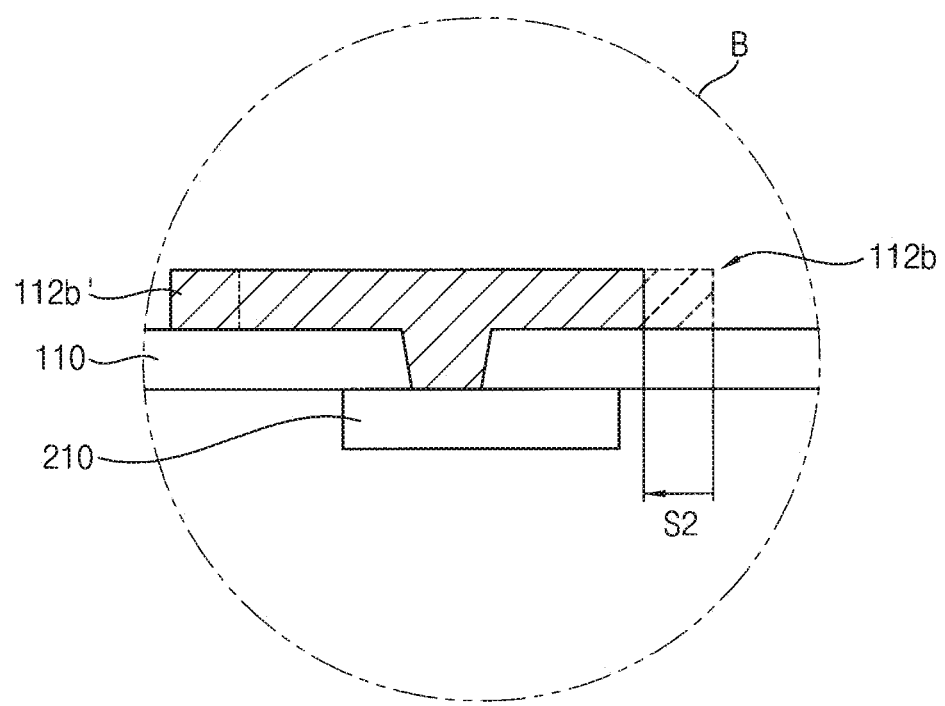

Accordingly, as illustrated in FIG. 9C, the first redistribution wiring 112b' formed by the exposure process in which the second correction value for each layer is reflected may be shifted by a second distance S2 in the reverse direction of the alignment error vector ($\vec{D}$) from the first redistribution wiring 112b formed by the exposure process according to the comparative embodiment.

Figure 10A:
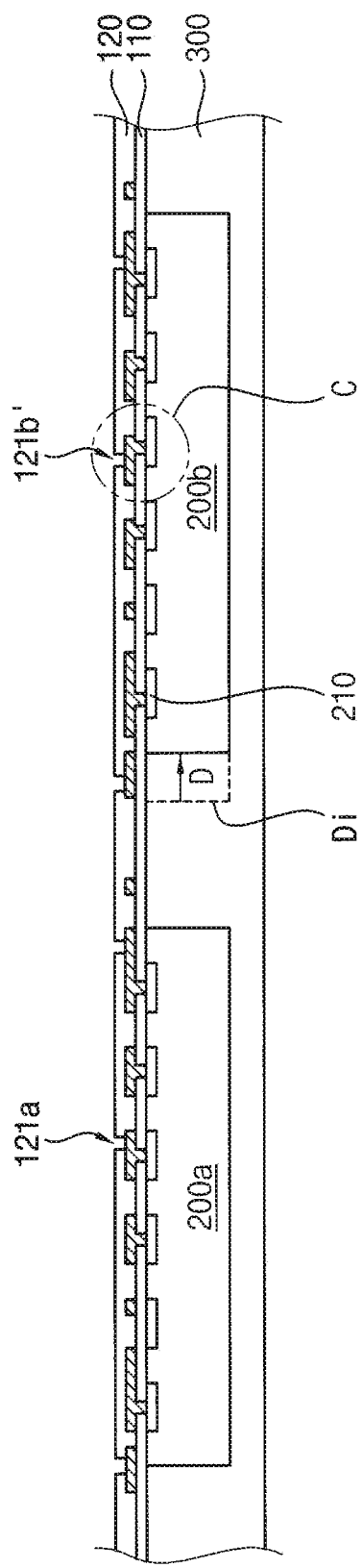

As illustrated in FIG. 10A, after forming a second insulating layer 120 to cover the first redistribution wirings 112a, 112b' on the first insulating layer 110, the second insulating layer 120 may be patterned to form second openings 121a, 121b' exposing the first redistribution wirings 112a, 112b' respectively.

The second insulating layer 120 may include, for example, a polymer or a dielectric material. The second insulating layer 120 may be formed by, for example, a vapor phase deposition process or a spin coating process.

The second openings 121a, 121b' may be formed by an exposure process. The exposure process may be performed in a local alignment manner according to a position of each of the semiconductor chips 200a, 200b. For example, the exposure process may be performed on each semiconductor using a stepper. Since the exposure process is performed to be aligned with the position of each semiconductor chip, the second openings may be matched to each semiconductor chip. When performing the exposure process, a die alignment key located in each semiconductor chip may be measured and the measured deviation may be taken into account, so that the exposure position can be aligned with each semiconductor chip.

Since an alignment error does not exist in the semiconductor chip 200a, the correction value for each layer may not be reflected in the exposure process. Accordingly, the exposure process performed on the second insulating layer 120 on the semiconductor chip 200a may be performed to be aligned with the position of the semiconductor chip 200a based on the die alignment key. Thus, the second opening 121a may be formed in the second insulating layer 120 by the exposure process that does not consider the correction value for each layer.

Since the alignment error D exists in the semiconductor chip 200b, the correction value for each layer may be reflected in the exposure process. Accordingly, the exposure process performed on the second insulating layer 120 on the semiconductor chip 200b may be performed based on the die alignment key such that the third correction value for each layer is reflected. Thus, the second opening 121b' may be formed in the second insulating layer 120 by the exposure process based on the third correction value for each layer.

Figure 10B:
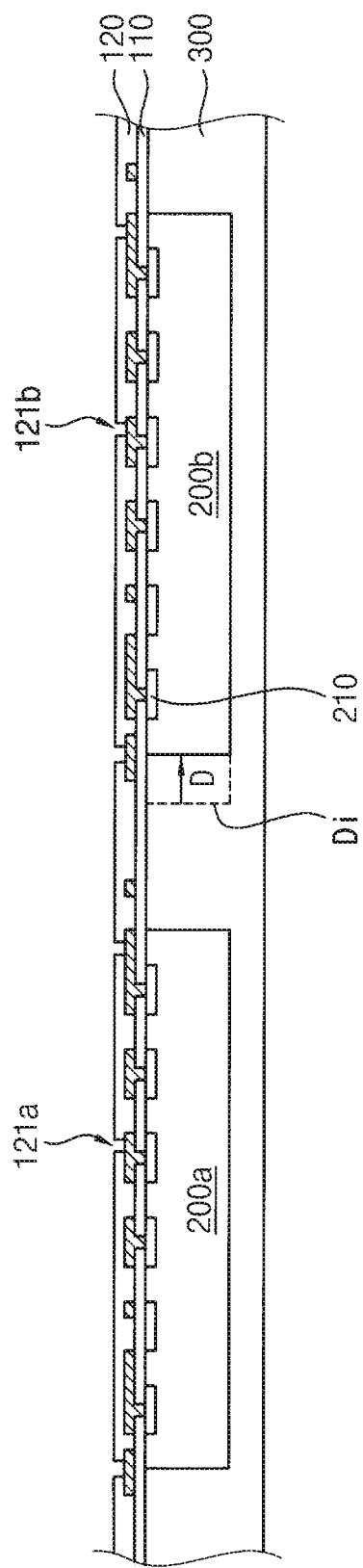

Referring to FIG. 10B, in the redistribution wiring process according to a comparative embodiment, although the alignment error D exists in the semiconductor chip 200b, an exposure process performed on the second insulating layer 120 on the semiconductor chip 200b may be performed to be aligned with the position of the semiconductor chip 200b based on the die alignment key without considering the correction value for each layer.

Figure 10C:
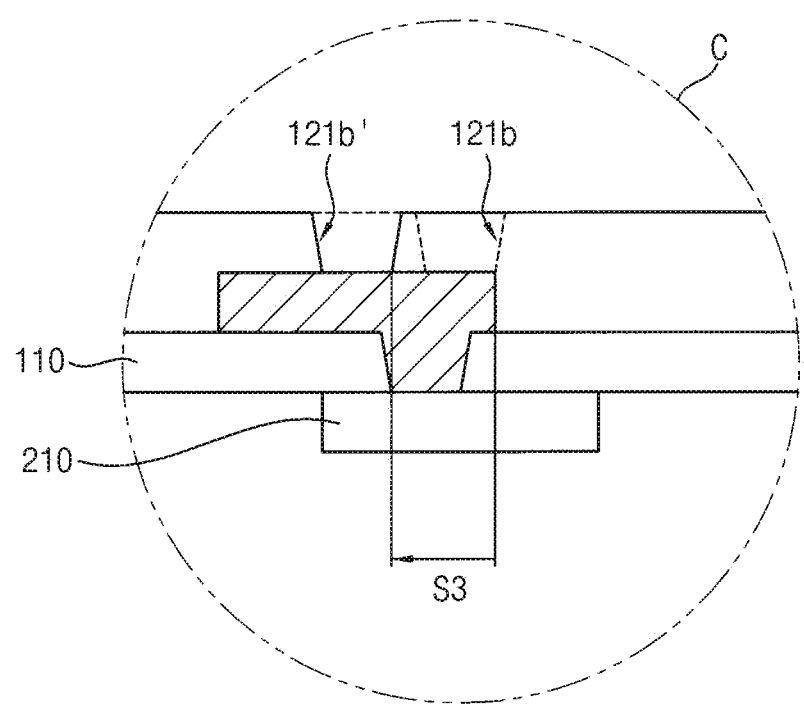

Accordingly, as illustrated in FIG. 10C, the second opening 121b' formed by the exposure process in which the third correction value for each layer is reflected may be shifted by a third distance S2 in the reverse direction of the alignment error vector ($\vec{D}$) from the second opening 121b formed by the exposure process according to the comparative embodiment.

Figure 11A:
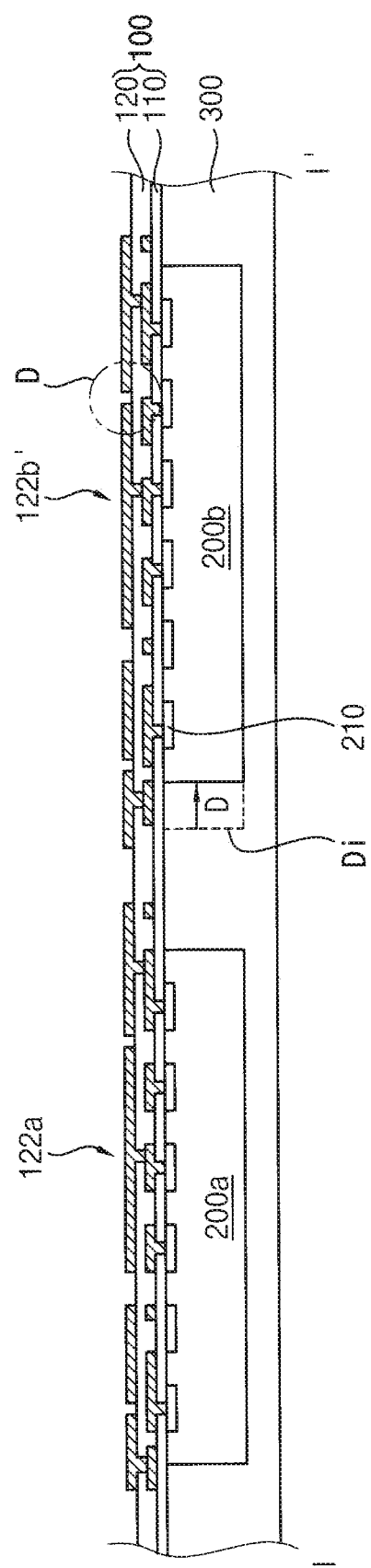

Referring to FIG. 11A, second redistribution wirings 122a, 122b' may be formed on the second insulating layer 120 to be directly connected to the first redistribution wirings 112a, 112b' through the second openings 121a, 121b'.

In example embodiments, the second redistribution wirings 122a, 122b' may be formed on portions of the second insulating layer 120 and the first redistribution wirings 112a, 112b', respectively. The second redistribution wirings 122a, 122b' may be formed by, after forming a seed layer on the second insulating layer 120 and in the second openings 121a, 121b', patterning the seed layer and performing an electrolytic plating process. Thus, the second redistribution wirings 122a, 122b' may directly contact the first redistribution wirings 112a, 112b' through the second openings.

For example, in order to pattern the seed layer, after forming a photoresist layer on the seed layer, an exposure process and a development process may be performed on the photoresist layer to form a second photoresist pattern for exposing a second redistribution wiring region. The electrolytic plating process may be performed to form the second redistribution wirings 122a, 122b' in the second redistribution wiring region defined by the second photoresist pattern. The second redistribution wirings 122a, 122b' may include Al, Cu, Sn, Ni, Au, Pt, or an alloy thereof.

Then, after removing the second photoresist pattern by a strip process, the remaining seed layer may be removed by a wet etch process.

In example embodiments, the second photoresist pattern for exposing the regions of the second redistribution wirings 122a, 122b' may be formed by the exposure process. The exposure process may be performed in a local alignment manner according to a position of each of the semiconductor chips 200a, 200b. For example, the exposure process may be performed on each semiconductor using a stepper. Since the exposure process is performed to be aligned with the position of each semiconductor chip, the second redistribution wirings may be matched to each semiconductor chip. When performing the exposure process, a die alignment key located in each semiconductor chip may be measured and the measured deviation may be taken into account, so that the exposure position can be aligned with each semiconductor chip.

Since an alignment error does not exist in the semiconductor chip 200a, the correction value for each layer may not be reflected in the exposure process. Accordingly, the exposure process performed on the photoresist layer on the semiconductor chip 200a may be performed to be aligned with the position of the semiconductor chip 200a based on the die alignment key. Thus, the second redistribution wiring 122a may be formed on the second insulating layer 120 by the exposure process that does not consider the correction value for each layer.

Since the alignment error D exists in the semiconductor chip 200b, the correction value for each layer may be reflected in the exposure process. Accordingly, the exposure process performed on the photoresist layer on the semiconductor chip 200b may be performed based on the die alignment key such that the second correction value for each layer is reflected. Thus, the second redistribution wiring 122b' may be formed on the second insulating layer 120 by the exposure process based on the fourth correction value for each layer.

Figure 11B:
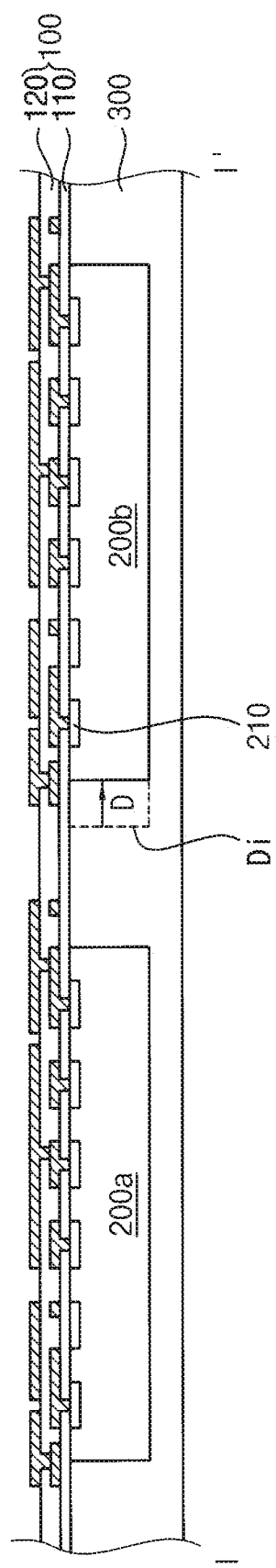

Referring to FIG. 11B, in the redistribution wiring process according to a comparative embodiment, although the alignment error D exists in the semiconductor chip 200b, an exposure process performed on the second photoresist layer on the semiconductor chip 200b may be performed to be aligned with the position of the semiconductor chip 200b based on the die alignment key without considering the correction value for each layer.

Figure 11C:
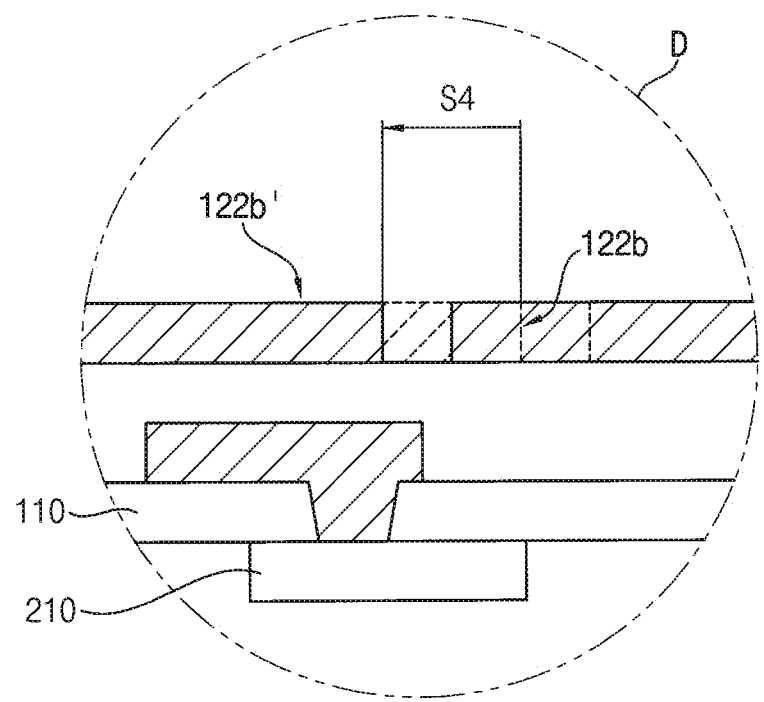

Accordingly, as illustrated in FIG. 11C, the second redistribution wiring 122b' formed by the exposure process in which the fourth correction value for each layer is reflected may be shifted by a fourth distance S4 in the reverse direction of the alignment error vector ($\vec{D}$) from the second redistribution wiring 122b formed by the exposure process according to the comparative embodiment. The fourth distance S4 may be an alignment correction value obtained by sequentially reflecting the first to fourth correction values for each layer.

A portion of the outermost second redistribution wiring may serve as a landing pad, that is, a package pad, on which an outer connection member such as a solder ball is disposed. In order to correct the alignment error D of the semiconductor chip 200b, the distributed first to fourth correction values for each layer may be sequentially reflected in the exposure processes for forming the first and second redistribution wiring layers of the redistribution wiring structure 100, to thereby secure in advance conformity margin required in a following solder ball process. Thus, in order to secure the conformity margin, it may not necessary to greatly enlarge a size of the landing pad of the outermost second redistribution wiring.

Figure 12A:
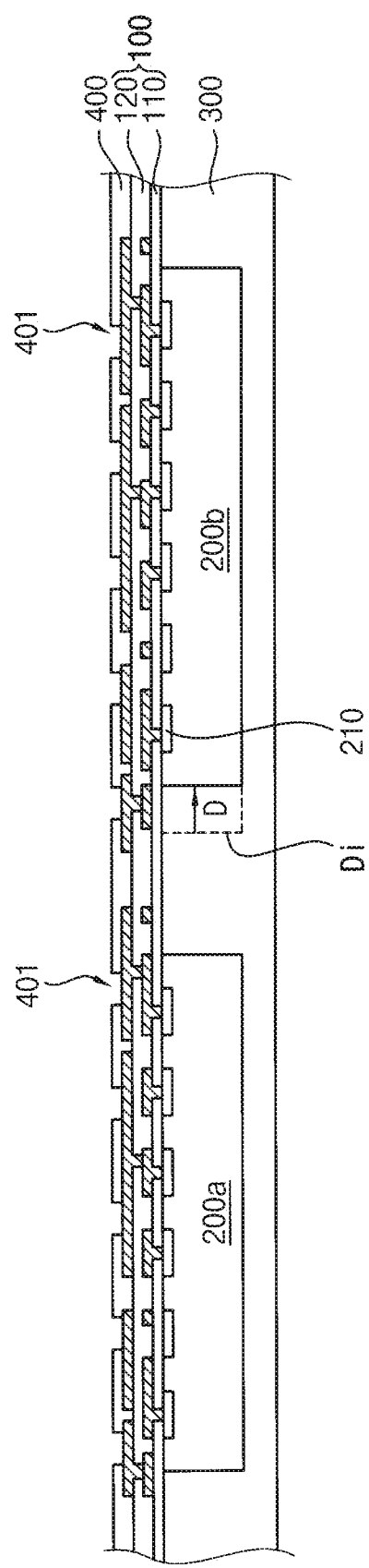
Figure 12B:
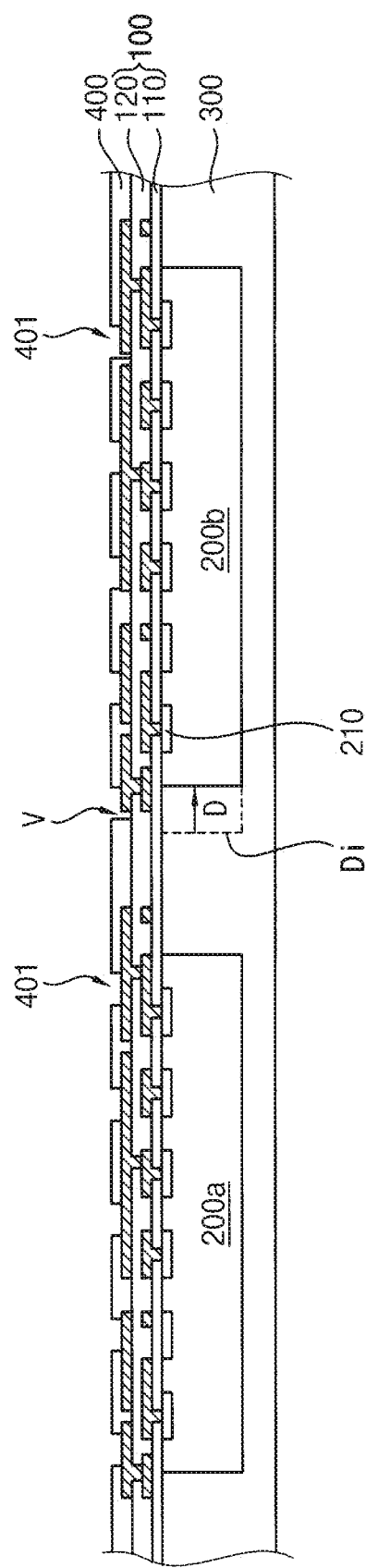
Figure 13A:
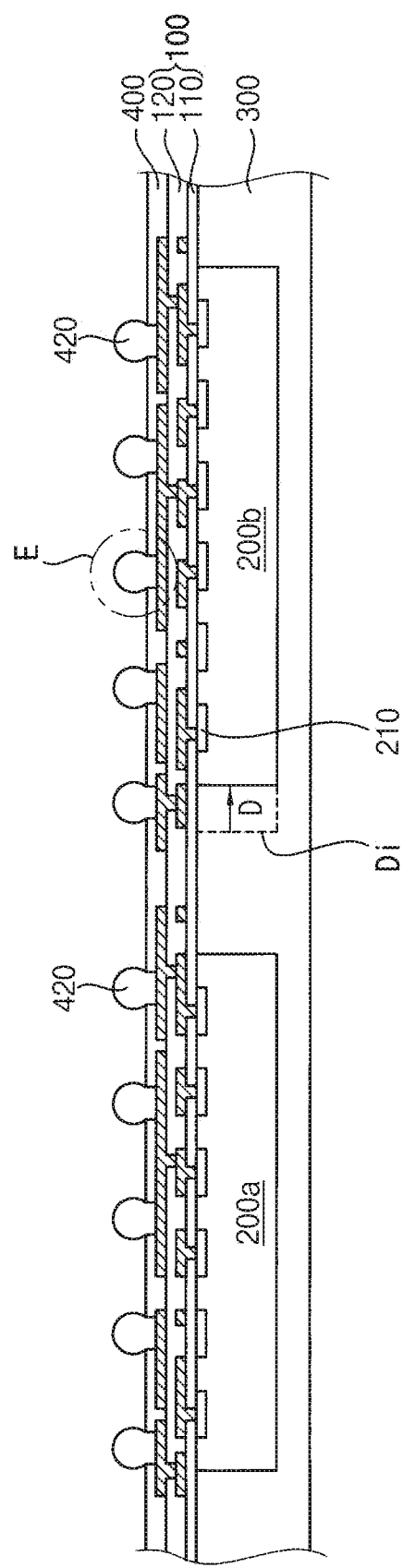
Figure 13B:
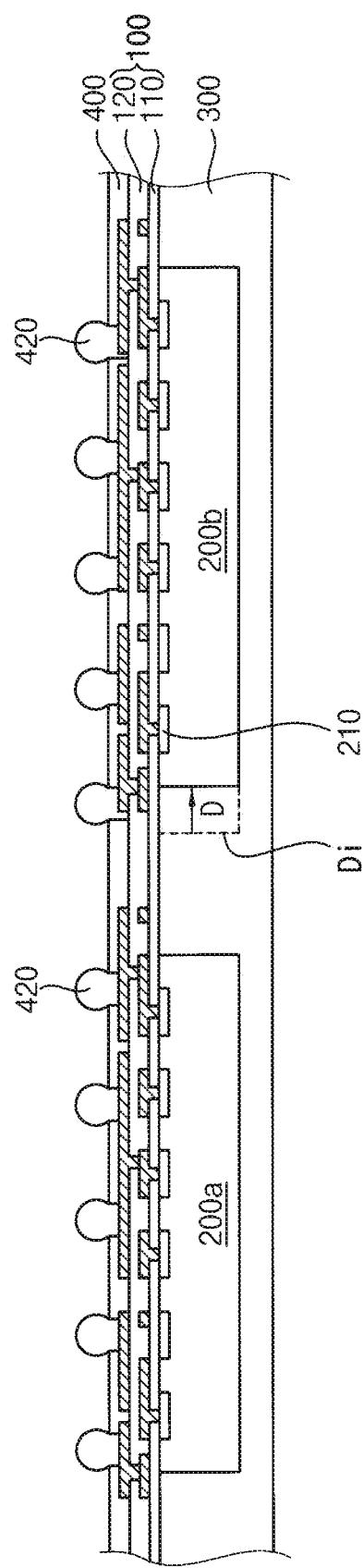
Figure 13C:
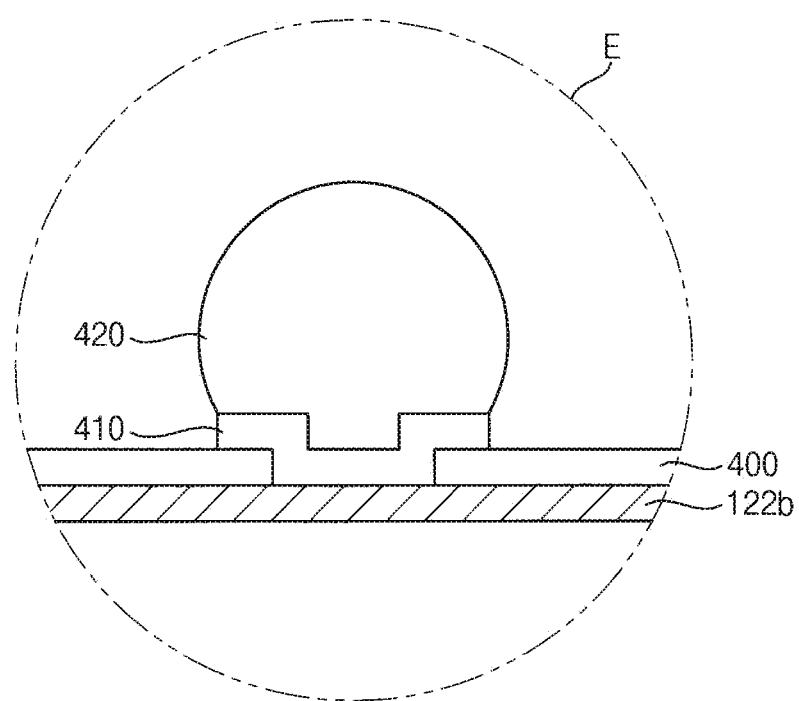
Figure 14:
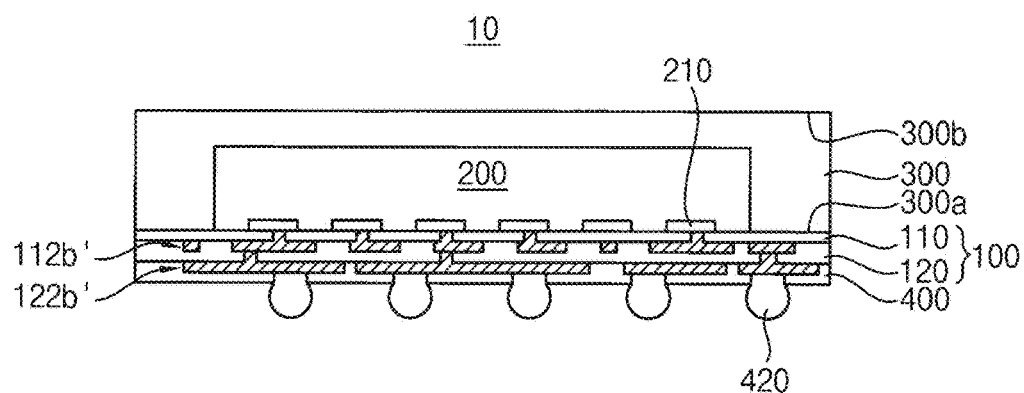

Referring to FIGS. 12A, 13A and 14, after forming outer connection members 420 on the redistribution wiring structure 100 to be electrically connected to the outermost second redistribution wirings, a singulation process may be performed on the carrier 300 to complete a fan-out package 10. FIGS. 12B and 13B illustrate solder ball process stages according to a comparative embodiment corresponding to solder ball process stages of FIGS. 12A and 13A respectively.

In example embodiments, a back-end process including the solder ball process and the singulation process may be performed in a global alignment manner according to a position of the carrier 300. The back-end process may be performed to be aligned with respect to a global reference target 310 of the carrier 300 without aligning with each semiconductor chip position. That is, a laser processing process of forming a protective pattern for exposing a region of the outermost second redistribution landing pad and the singulation process may be performed using the global reference target outside the semiconductor chips. Accordingly, the back-end process may be performed entirely on the carrier based on the design origin coordinate (Oi) of each of the semiconductor chips without considering the alignment error of each of the semiconductor chips.

As illustrated in FIG. 12A, after forming a protective layer 400 on the second insulating layer 120 to cover the outermost second redistribution wirings 122a, 122b', the protective layer 400 may be patterned to form holes 401 exposing landing pad regions of the outermost second redistribution wirings 122a, 122b' respectively.

The holes 401 may be formed by the laser processing process. The laser processing process may be performed in the global alignment manner according to the position of the carrier 300. That is, the laser processing process of forming the holes for exposing the landing pad regions of the outermost second redistribution wirings may be performed using the global reference target outside the semiconductor chips. Accordingly, the laser processing process may be performed entirely on the carrier based on the design origin coordinate (Oi) of each of the semiconductor chips without considering the alignment error of each of the semiconductor chips.

Referring to FIG. 12B, in a solder ball process according to a comparative embodiment, since the holes 401 are formed in the global alignment manner without considering the alignment error of each of the semiconductor chips 200a, 200b, a misalignment V between the hole 401 of the protective layer 400 and the outermost second redistribution wiring 121b' may occur due to the alignment error D, so that the outermost second redistribution wiring may be required to have a large landing area.

As illustrated in FIG. 13A, after forming the outer connection members 420 may be disposed on the landing pads of the outermost second redistribution wirings 122a, 122b' exposed by the holes 401.

For example, after forming an under bump metallurgy (UBM) layer 410 on the exposed landing pads of the outermost second redistribution wirings 122a, 122b', solder balls as the outer connection members may be formed on the under bump metallurgy layer 410. The solder balls may be formed respectively on the package pads on an outer surface of the redistribution wiring structure 100 by a solder ball attach process. The solder ball may have a diameter of about 100 μm to about 500 μm.

As mentioned above, the first to fourth correction values for each layer distributed in order to correct the alignment error D of the semiconductor chip 200b may be sequentially reflected in the exposure processes for forming the first and second redistribution wiring layers of the redistribution wiring structure 100 to limit and/or prevent the eccentricity occurring in the outermost redistribution wiring due to the alignment error D, to thereby secure in advance conformity margin required in a following solder ball process. Accordingly, in order to secure the conformity margin, it may not necessary to greatly enlarge a size of the landing pad of the outermost second redistribution wiring.

Thus, as the pad size of the outermost redistribution wiring is reduced, gas discharge of reaction products and volatile solvents of an underlying layer may be facilitated. Further, input/output and power wirings may be additionally disposed through an area secured by reducing the pad size of the redistribution wiring, and as the clearance required in the singulation process is reduced, wiring, shielding, or dummy metal may be arranged to the outer periphery of the package to thereby improve electrical characteristics (PI, SI, EMI), mechanical strength, and heat dissipation characteristics. By reducing the size of the package through the reduction of the clearance, it may be possible to obtain the effect of miniaturization and cost reduction.

Figure 15A:
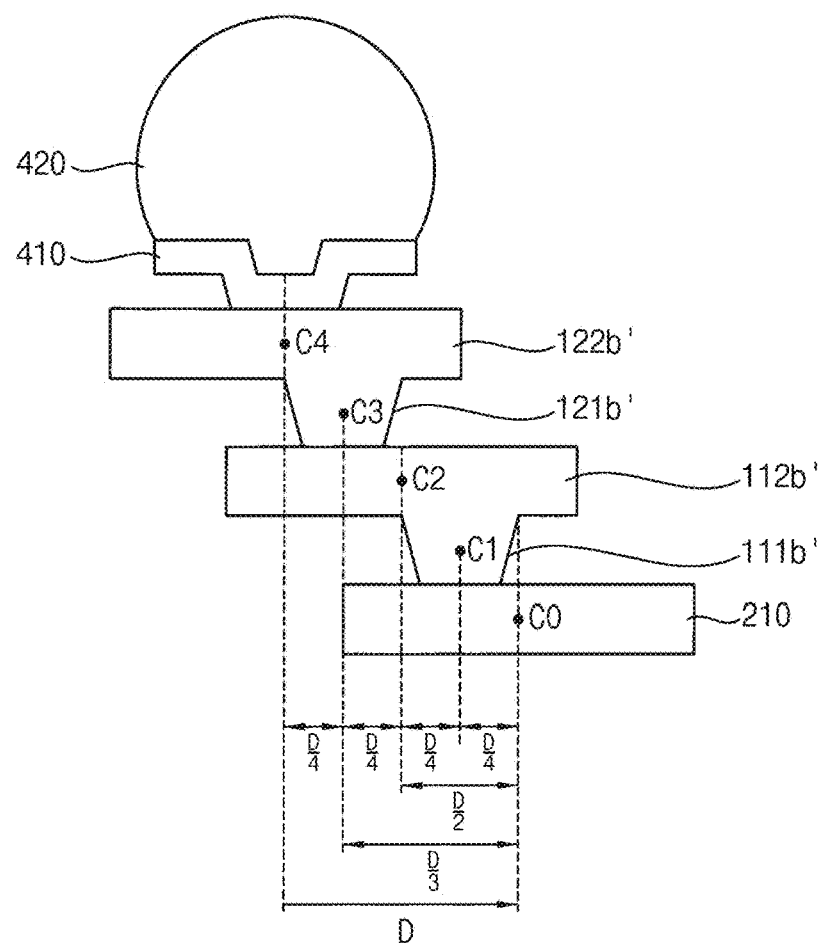
FIG. 15A is a view illustrating a redistribution wiring structure formed by a method of manufacturing a semiconductor package in accordance with an example embodiment.
Figure 15B:
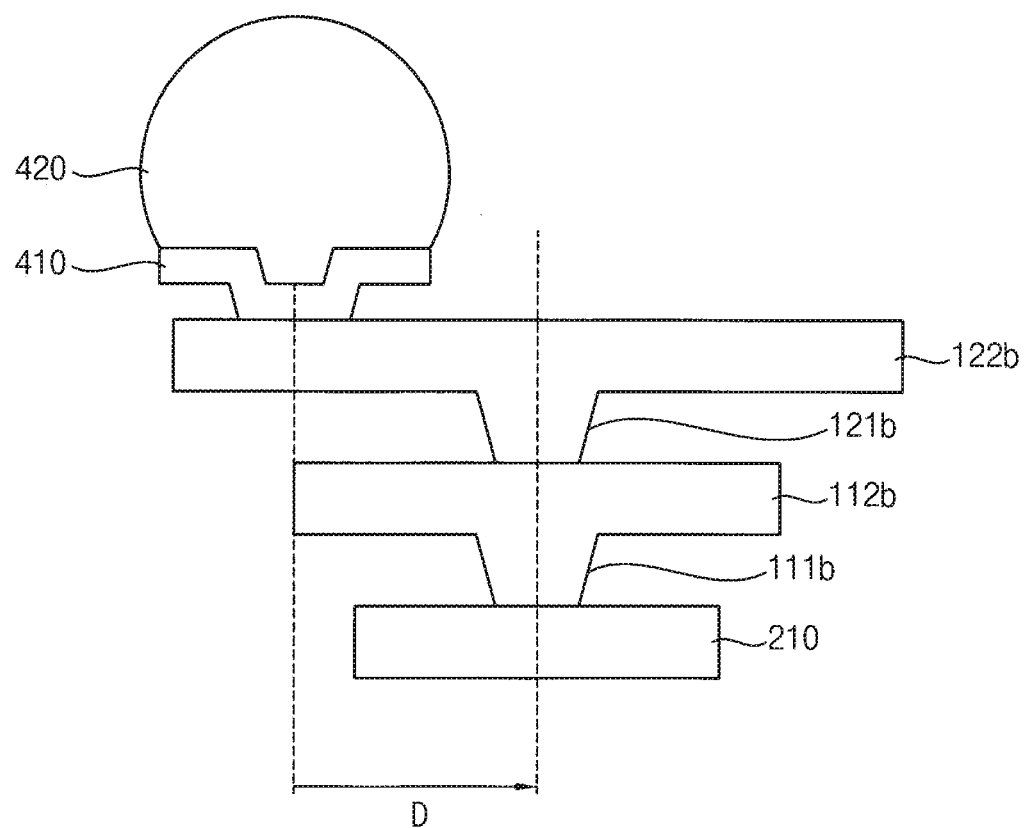
FIG. 15B is a view illustrating a redistribution wiring structure formed by a method of manufacturing a semiconductor package in accordance with a comparative embodiment.

FIG. 15A is a view illustrating a redistribution wiring structure formed by a method of manufacturing a semiconductor package in accordance with an example embodiment. FIG. 15B is a view illustrating a redistribution wiring structure formed by a method of manufacturing a semiconductor package in accordance with a comparative embodiment. For convenience of explanation, a case where it is designed that the redistribution wiring structure has first and second redistribution wiring layers, and the centers of vias (first and second openings) of the first and second redistribution wiring layers and redistribution wirings (first and second redistribution wirings) coincide with the center of the chip pad will be described.

Referring to FIG. 15A, according to an example embodiment, in case that a chip pad 210 of a semiconductor chip embedded in a carrier has an alignment error D, first to fourth correction values for each layer may be reflected respectively in first to fourth exposure processes for forming the first and second redistribution wiring layers to thereby secure in advance margin required in a back-end process. The first to fourth correction values for each layer may be the same as each other. The chip pad 210 has an exposure position C0.

In particular, an exposure position C1 of a first via (first opening) 111b' may be shifted by the first correction value for each layer (−D/4), an exposure position C2 of a first redistribution wiring 112b' may be shifted by the second correction value for each layer (−D/4), an exposure position C3 of a second via (second opening) 121b' may be shifted by the third correction value for each layer (−D/4), and an exposure position C4 of a second redistribution wiring 122b' may be shifted by the fourth correction value for each layer (−D/4).

Referring to FIG. 15B, according to a comparative embodiment, first to fourth exposure processes for forming the first and second redistribution wiring layers may be performed to be aligned with the position of the chip pad 210 without considering the correction value for each layer.

Accordingly, a landing pad of the outermost second redistribution wiring 122b of FIG. 15B may be required to have a pad area larger than a landing pad of the outermost second redistribution wiring 122b' of FIG. 15A, in order to obtain conformity margin required in a following solder ball process. For example, in case that the landing pad of the outermost second redistribution wiring 122b has a diameter of 50 μm, even if a diameter of the landing pad of the outermost second redistribution wiring 122b' of FIG. 15A is reduced to 20 μm, it may be possible to meet the conformity margin required for the back-end process.

Figure 16A:
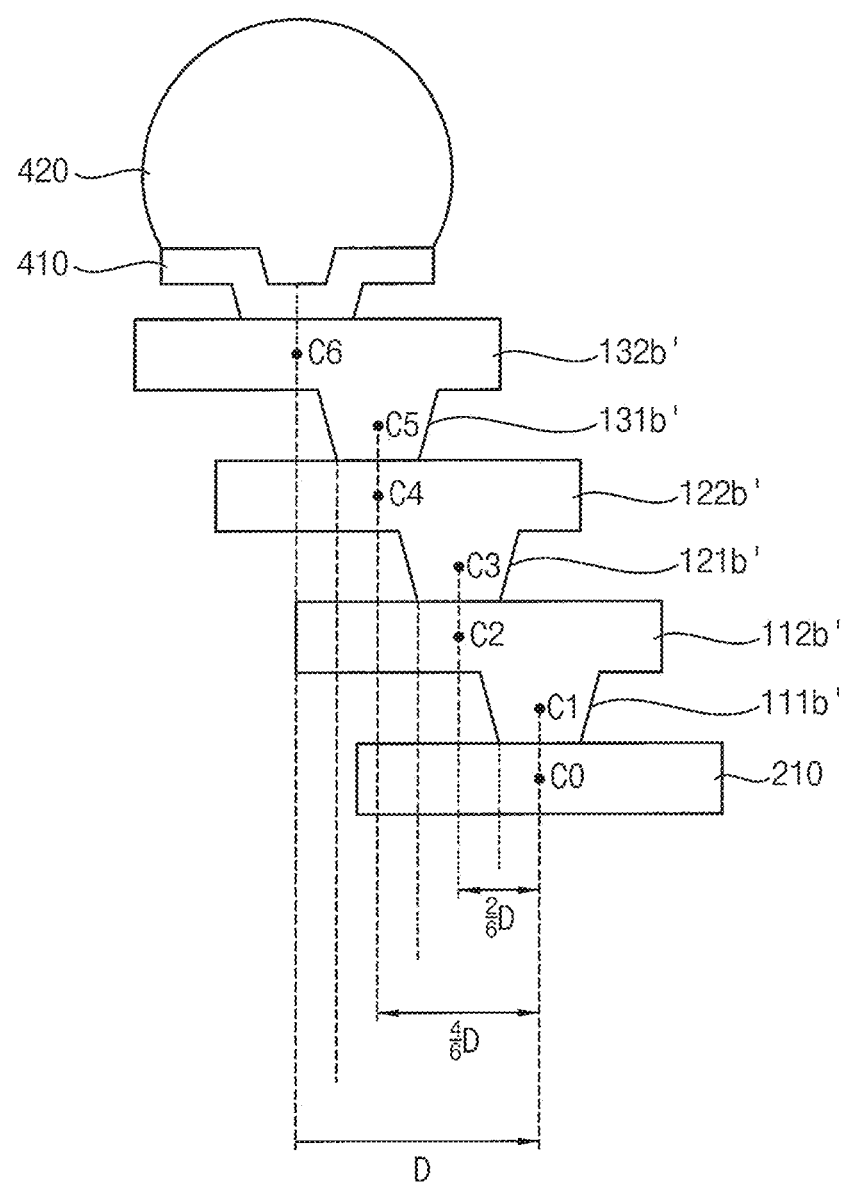
FIG. 16A is a view illustrating a redistribution wiring structure formed by a method of manufacturing a semiconductor package in accordance with an example embodiment.
Figure 16B:
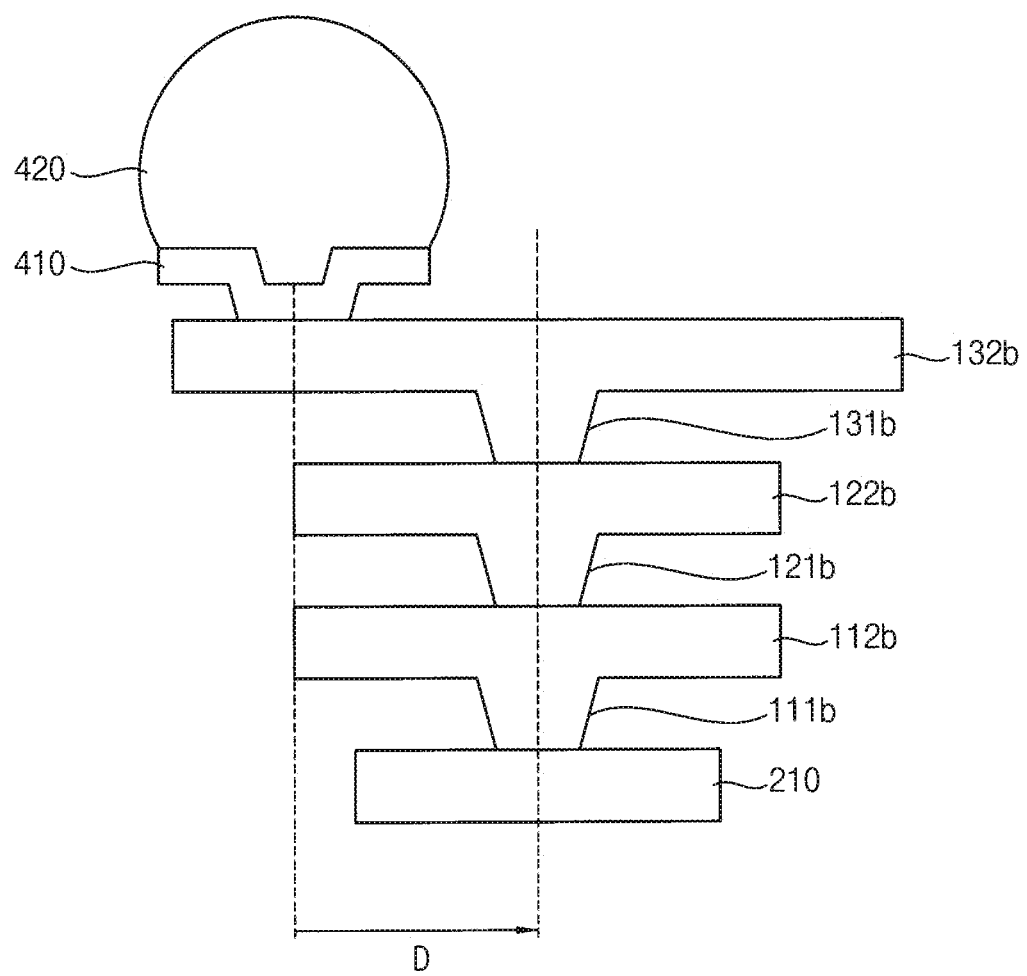

FIG. 16A is a view illustrating a redistribution wiring structure formed by a method of manufacturing a semiconductor package in accordance with an example embodiment. FIG. 16B is a view illustrating a redistribution wiring structure formed by a method of manufacturing a semiconductor package in accordance with a comparative embodiment. For convenience of explanation, a case where it is designed that the redistribution wiring structure has first, second and third redistribution wiring layers, and the centers of vias (first, second and third openings) of the first, second and third redistribution wiring layers and redistribution wirings (first, second and third redistribution wirings) coincide with the center of the chip pad will be described.

Referring to FIG. 16A, according to an example embodiment, in case that a chip pad 210 of a semiconductor chip embedded in a carrier has an alignment error D, first to sixth correction values for each layer may be reflected respectively in first to sixth exposure processes for forming the first, second and third redistribution wiring layers to thereby secure in advance margin required in a back-end process. The first to sixth correction values for each layer may be the same as each other.

In particular, an exposure position C1 of a first via (first opening) 111b' may be shifted by the first correction value for each layer (0), an exposure position C2 of a first redistribution wiring 112b' may be shifted by the second correction value for each layer (−D/3), an exposure position C3 of a second via (second opening) 121b' may be shifted by the third correction value for each layer (0), an exposure position C4 of a second redistribution wiring 122b' may be shifted by the fourth correction value for each layer (−D/3), an exposure position C5 of a third via (third opening) 131b' may be shifted by the fifth correction value for each layer (0), and an exposure position C6 of a third redistribution wiring 132b' may be shifted by the sixth correction value for each layer (−D/3).

Accordingly, a landing pad of the outermost third redistribution wiring 132b of FIG. 16B may be required to have a pad area larger than a landing pad of the outermost third redistribution wiring 132b' of FIG. 16A, in order to obtain conformity margin required in a following solder ball process. Even if a diameter of the landing pad of the outermost third redistribution wiring 132b' of FIG. 16A is reduced, it may be possible to meet the conformity margin required for the back-end process.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and effects of inventive concepts. Accordingly, all such modifications are intended to be included within the scope of example embodiments as defined in the claims.

What is claimed is:

1. A method of manufacturing a semiconductor package, the method comprising:
   encapsulating a plurality of semiconductor chips in a carrier to provide encapsulated semiconductor chips, a first surface of each of the encapsulated semiconductor chips including chip pads exposed from a first surface of the carrier, the carrier not covering the first surface of the encapsulated semiconductor chips such that the first surface of the carrier exposes the first surface of each of the encapsulated semiconductor chips;
   measuring an alignment error of each of the encapsulated semiconductor chips with respect to the carrier;
   forming a redistribution wiring structure on the first surface of the carrier, the forming the redistribution wiring structure including reflecting correction values for each layer of the redistribution wiring structure in order to correct the alignment error while forming the redistribution wiring structure such that exposure processes reflecting the correction values for each layer of the redistribution wiring structure are shifted based on the correction values that have been reflected to correct the alignment error, the redistribution wiring structure having redistribution wirings electrically connected to the chip pads of the encapsulated semiconductor chips, the redistribution wirings being shifted in a reverse direction of the alignment error based on the correction values that have been reflected to correct the alignment error, the redistribution wiring structure having outermost redistribution wirings among the redistribution wirings; and forming outer connection members on the redistribution wiring structure, the outer connection members being electrically connected to the outermost redistribution wirings, wherein the forming the outer connection members on the redistribution wiring structure is performed in a global alignment manner according to a position of a global reference target on the carrier, and wherein the forming the redistribution wiring structure comprises performing an exposure process in a local alignment manner according to a position of each of the encapsulated semiconductor chips.

2. The method of claim 1, wherein the forming the redistribution wiring structure comprises:

determining the correction values for each layer of a plurality of redistribution wiring layers of the redistribution wiring structure based on the alignment error of each of the encapsulated semiconductor chips; and forming the plurality of the redistribution wiring layers on the first surface of the carrier using the exposure processes reflecting the correction values.

3. The method of claim 2, wherein the forming the redistribution wiring structure comprises:

forming a first insulating layer on the first surface of the carrier;

forming a first opening in the first insulating layer, the forming the first opening including performing a first exposure process based on a first correction value for each layer of exposure positions in the redistribution wiring structure at a level equal to or below the first insulating layer; and forming a first redistribution wiring on the first insulating layer, the first redistribution wiring filling the first opening, the forming the first redistribution wiring including performing a second exposure process based on a second correction value for each layer of exposure positions in the redistribution wiring structure at a level equal to or below the first redistribution wiring, and the plurality of redistribution wiring layers including the first redistribution wiring.

4. The method of claim 3, wherein the first correction value for each layer is the same as the second correction value for each layer.

5. The method of claim 3, wherein the first correction value for each layer and the second correction value for each layer have an inverse vector value of an alignment error vector.

6. The method of claim 1, wherein the forming the outer connection members on the redistribution wiring structure comprises:

forming a protective layer on the redistribution wiring structure, the protective layer including holes that expose portions of the outermost redistribution wirings;

forming an under bump metallurgy layer on the portions of the redistribution wirings exposed by the holes; and disposing solder balls on the under bump metallurgy layer.

7. The method of claim 1, wherein the measuring the alignment error of each of the encapsulated semiconductor chips with respect to the carrier comprises measuring a displacement value of each of the encapsulated semiconductor chips with respect to a global reference target.

8. The method of claim 7, wherein the global reference target includes a carrier alignment key positioned outside of the encapsulated semiconductor chips.

9. The method of claim 1, wherein the correction values for each layer of the redistribution wiring structure are equal.

10. A method of manufacturing a semiconductor package, the method comprising:

encapsulating a plurality of semiconductor chips in a carrier to provide encapsulated semiconductor chips, a first surface of each of the encapsulated semiconductor chips including chip pads exposed from a first surface of the carrier, the carrier not covering the first surface of the encapsulated semiconductor chips such that the first surface of the carrier exposes the first surface of each of the encapsulated semiconductor chips;

measuring an alignment error of each of the encapsulated semiconductor chips with respect to the carrier;

determining correction values for each layer of a plurality of redistribution wiring layers of a redistribution wiring structure to be stacked on the first surface of the carrier, based on the alignment error of each of the encapsulated semiconductor chips;

forming the redistribution wiring structure on the first surface of the carrier, the forming the redistribution wiring structure including reflecting the correction values while forming the plurality of the redistribution wiring layers of the redistribution wiring structure to correct the alignment error such that exposure processes reflecting the correction values for each layer of the redistribution wiring structure are shifted based on the correction values that have been reflected to correct the alignment error, the plurality of redistribution wiring layers being shifted in a reverse direction of the alignment error based on the correction values that have been reflected to correct the alignment error, the redistribution wiring structure having outermost redistribution wirings; and forming outer connection members on the redistribution wiring structure, the outer connection members being electrically connected to the outermost redistribution wirings, wherein the forming the outer connection members on the redistribution wiring structure is performed in a global alignment manner according to a position of a global reference target on the carrier, and wherein the forming the redistribution wiring structure comprises performing an exposure process in a local alignment manner according to a position of each of the encapsulated semiconductor chips.

11. The method of claim 10, wherein the forming the redistribution wiring structure comprises:

forming a first insulating layer on the first surface of the carrier;

forming a first opening in the first insulating layer, the forming the first opening including performing a first exposure process based on a first correction value for each layer of exposure positions in the redistribution wiring structure at a level equal to or below the first insulating layer; and forming a first redistribution wiring on the first insulating layer, the first redistribution wiring filling the first opening, the forming the first redistribution wiring including performing a second exposure process based on a second correction value for each layer of exposure positions in the redistribution wiring structure at a level equal to or below the first redistribution wiring, and the plurality of redistribution wiring layers including the first redistribution wiring.

12. The method of claim 11, wherein the first correction value for each layer is the same as the second correction value for each layer.

13. The method of claim 11, wherein the first correction value for each layer and the second correction value for each layer have an inverse vector value of an alignment error vector.

14. The method of claim 10, wherein the encapsulating the plurality of the semiconductor chips comprises:
    arranging the plurality of semiconductor chips on a dummy substrate;
    forming the carrier on the dummy substrate to cover the plurality of semiconductor chips and provide the encapsulated semiconductor chips; and
    removing the dummy substrate such that the encapsulated semiconductor chips are exposed from the first surface of the carrier.

15. The method of claim 14, wherein forming the carrier comprises: forming a molding member on the dummy substrate by a molding process; and curing the molding member.

16. The method of claim 10, wherein the measuring the alignment error of each of the encapsulated semiconductor chips with respect to the carrier comprises measuring a displacement value of each of the encapsulated semiconductor chips with respect to a global reference target.

17. The method of claim 16, wherein the global reference target includes a carrier alignment key positioned outside of the encapsulated semiconductor chips.

18. The method of claim 10, wherein the correction values for each layer of the redistribution wiring structure are equal.

19. A method of manufacturing a semiconductor package, the method comprising:
    encapsulating a plurality of semiconductor chips in a carrier to provide encapsulated semiconductor chips, a first surface of each of the encapsulated semiconductor chips including chip pads exposed from a first surface of the carrier, the carrier not covering the first surface of the encapsulated semiconductor chips such that the first surface of the carrier exposes the first surface of each of the encapsulated semiconductor chips;
    measuring an alignment error of each of the encapsulated semiconductor chips with respect to the carrier;
    forming a redistribution wiring structure on the first surface of the carrier, the forming the redistribution wiring structure including reflecting correction values for each layer of the redistribution wiring structure in order to correct the alignment error while forming the redistribution wiring structure such that exposure processes reflecting the correction values for each layer of the redistribution wiring structure are shifted based on the correction values that have been reflected to correct the alignment error, the redistribution wiring structure having redistribution wirings electrically connected to the chip pads of the encapsulated semiconductor chips, the redistribution wirings being shifted in a reverse direction of the alignment error based on the correction values that have been reflected to correct the alignment error, the redistribution wiring structure having outermost redistribution wirings among the redistribution wirings; and
    forming outer connection members on the redistribution wiring structure, the outer connection members being electrically connected to the outermost redistribution wirings,
    wherein the forming the outer connection members on the redistribution wiring structure is performed in a global alignment manner according to a position of a global reference target on the carrier, and
    wherein the correction values for each layer of the redistribution wiring structure are equal.

* * * * *

UNITED STATES PATENT AND TRADEMARK OFFICE
CERTIFICATE OF CORRECTION

| | |
|---|---|
| PATENT NO. | : 11,972,966 B2 |
| APPLICATION NO. | : 17/007433 |
| DATED | : April 30, 2024 |
| INVENTOR(S) | : Gyujin Choi et al. |

Page 1 of 1

It is certified that error appears in the above-identified patent and that said Letters Patent is hereby corrected as shown below:

On the Title Page

Item (54) and in the Specification Column 1, Lines 1-5, The correct title should be as follows: "METHOD OF MANUFACTURING A SEMICONDUCTOR PACKAGE INCLUDING CORRECTING ALIGNMENT ERROR WHILE FORMING REDISTRIBUTION WIRING STRUCTURE"

Signed and Sealed this
Tenth Day of February, 2026

John A. Squires
*Director of the United States Patent and Trademark Office*